United States Patent
Shah et al.

(10) Patent No.: US 9,573,812 B2
(45) Date of Patent: Feb. 21, 2017

(54) CNT-INFUSED METAL FIBER MATERIALS AND PROCESS THEREFOR

(71) Applicant: APPLIED NANOSTRUCTURED SOLUTIONS, LLC, Baltimore, MD (US)

(72) Inventors: Tushar K. Shah, Fulton, MD (US); Slade H. Gardner, Redwood City, CA (US); Mark R. Alberding, Glen Arm, MD (US); Harry C. Malecki, Jupiter, FL (US)

(73) Assignee: Applied NanoStructured Solutions, LLC, Baltimore, MD (US)

( * ) Notice: Subject to any disclaimer, the term of this patent is extended or adjusted under 35 U.S.C. 154(b) by 346 days.

(21) Appl. No.: 14/582,034

(22) Filed: Dec. 23, 2014

(65) Prior Publication Data

US 2016/0130147 A1 May 12, 2016

Related U.S. Application Data

(60) Division of application No. 12/611,073, filed on Nov. 2, 2009, now Pat. No. 8,951,631, which is a
(Continued)

(51) Int. Cl.
*C01B 31/02* (2006.01)
*B22F 3/00* (2006.01)
(Continued)

(52) U.S. Cl.
CPC .......... *C01B 31/0226* (2013.01); *B05C 3/125* (2013.01); *B05D 1/18* (2013.01);
(Continued)

(58) Field of Classification Search
CPC .. D06M 11/74; D06M 2101/16; D06M 11/73; D06M 2101/40; B82Y 40/00
See application file for complete search history.

(56) References Cited

U.S. PATENT DOCUMENTS

| | | | |
|---|---|---|---|
| 2,412,707 A | 12/1946 | Barnett | |
| 3,304,855 A | 2/1967 | Oebell | |

(Continued)

FOREIGN PATENT DOCUMENTS

| | | |
|---|---|---|
| CA | 2476881 | 9/2003 |
| CN | 1345694 A | 4/2002 |

(Continued)

OTHER PUBLICATIONS

"Aramid Fibers," DuPont Nemours Inc. Apr. 30, 2001, <http://www.chem.uwec.edu/Chem405_S01/malenirt/project.html>.
(Continued)

*Primary Examiner* — Kelly M Gambetta
(74) *Attorney, Agent, or Firm* — McDermott Will & Emery LLP

(57) ABSTRACT

A composition includes a carbon nanotube (CNT)-infused metal fiber material which includes a metal fiber material of spoolable dimensions, a barrier coating conformally disposed about the metal fiber material, and carbon nanotubes (CNTs) infused to the metal fiber material. A continuous CNT infusion process includes: (a) disposing a barrier coating and a carbon nanotube (CNT)-forming catalyst on a surface of a metal fiber material of spoolable dimensions; and (b) synthesizing carbon nanotubes on the metal fiber material, thereby forming a carbon nanotube-infused metal fiber material.

18 Claims, 9 Drawing Sheets

Related U.S. Application Data continuation-in-part of application No. 11/619,327, filed on Jan. 3, 2007, now Pat. No. 8,158,217.

(60) Provisional application No. 61/168,516, filed on Apr. 10, 2009, provisional application No. 61/169,055, filed on Apr. 14, 2009, provisional application No. 61/155,935, filed on Feb. 27, 2009, provisional application No. 61/157,096, filed on Mar. 3, 2009, provisional application No. 61/182,153, filed on May 29, 2009.

(51) Int. Cl.
| | |
|---|---|
| *C22C 47/04* | (2006.01) |
| *B05C 3/12* | (2006.01) |
| *B05D 7/20* | (2006.01) |
| *C23C 16/02* | (2006.01) |
| *C23C 16/26* | (2006.01) |
| *C23C 16/453* | (2006.01) |
| *C23C 16/54* | (2006.01) |
| *B05D 1/18* | (2006.01) |
| *B05D 7/00* | (2006.01) |

(52) U.S. Cl.
CPC ............ *B05D 7/20* (2013.01); *B05D 7/544* (2013.01); *B22F 3/002* (2013.01); *C22C 47/04* (2013.01); *C23C 16/02* (2013.01); *C23C 16/0272* (2013.01); *C23C 16/26* (2013.01); *C23C 16/453* (2013.01); *C23C 16/545* (2013.01); *Y10S 977/742* (2013.01); *Y10S 977/75* (2013.01); *Y10S 977/752* (2013.01); *Y10S 977/843* (2013.01); *Y10T 428/292* (2015.01); *Y10T 428/2924* (2015.01)

(56) References Cited

U.S. PATENT DOCUMENTS

| | | |
|---|---|---|
| 4,300,821 A | 11/1981 | Mignen |
| 4,515,107 A | 5/1985 | Fournier et al. |
| 4,530,750 A | 7/1985 | Aisenberg et al. |
| 4,566,969 A | 1/1986 | Klein |
| 4,707,349 A | 11/1987 | Hjersted |
| 4,759,950 A | 7/1988 | Stevens |
| 4,797,378 A | 1/1989 | Sowman |
| 4,920,917 A | 5/1990 | Nakatani et al. |
| 5,093,155 A | 3/1992 | Miyazaki et al. |
| 5,130,194 A | 7/1992 | Baker et al. |
| 5,173,367 A | 12/1992 | Liimatta et al. |
| 5,221,605 A | 6/1993 | Bard et al. |
| 5,225,659 A | 7/1993 | Kusano et al. |
| 5,238,808 A | 8/1993 | Bard et al. |
| 5,246,794 A | 9/1993 | Blomgren et al. |
| 5,310,687 A | 5/1994 | Bard et al. |
| 5,470,408 A | 11/1995 | Nielson et al. |
| 5,514,217 A | 5/1996 | Niino et al. |
| 5,547,525 A | 8/1996 | Bennett et al. |
| 5,571,749 A | 11/1996 | Matsuda et al. |
| 5,589,007 A | 12/1996 | Fujioka et al. |
| 5,595,750 A | 1/1997 | Jacobson et al. |
| 5,639,984 A | 6/1997 | Nielson |
| 5,714,089 A | 2/1998 | Bard et al. |
| 5,731,147 A | 3/1998 | Bard et al. |
| 5,764,004 A | 6/1998 | Rabinowitz |
| 5,780,101 A | 7/1998 | Nolan et al. |
| 5,908,585 A | 6/1999 | Shibuta |
| 5,968,274 A | 10/1999 | Fujioka et al. |
| 5,997,832 A | 12/1999 | Lieber et al. |
| 6,072,930 A | 6/2000 | Kornreich et al. |
| 6,140,138 A | 10/2000 | Bard et al. |
| 6,146,462 A | 11/2000 | Yializis et al. |
| 6,146,642 A | 11/2000 | Garcia-Sastre et al. |
| 6,184,280 B1 | 2/2001 | Shibuta |
| 6,221,154 B1 | 4/2001 | Lee et al. |
| 6,232,706 B1 | 5/2001 | Dai et al. |
| 6,251,520 B1 | 6/2001 | Blizzard et al. |
| 6,270,897 B1 | 8/2001 | Flautt et al. |
| 6,331,209 B1 | 12/2001 | Jang et al. |
| 6,333,016 B1 | 12/2001 | Resasco et al. |
| 6,344,232 B1 | 2/2002 | Jones et al. |
| 6,346,189 B1 | 2/2002 | Dai et al. |
| 6,361,861 B2 | 3/2002 | Gao et al. |
| 6,413,487 B1 | 7/2002 | Resasco et al. |
| 6,420,293 B1 | 7/2002 | Chang et al. |
| 6,440,277 B1 | 8/2002 | D'Amato |
| 6,455,021 B1 | 9/2002 | Saito |
| 6,465,057 B1 | 10/2002 | Nakahigashi et al. |
| 6,479,028 B1 | 11/2002 | Kaner et al. |
| 6,491,789 B2 | 12/2002 | Niu |
| 6,495,258 B1 | 12/2002 | Chen et al. |
| 6,528,572 B1 | 3/2003 | Patel et al. |
| 6,564,744 B2 | 5/2003 | Nakahigashi et al. |
| 6,653,619 B2 | 11/2003 | Chin et al. |
| 6,673,392 B2 | 1/2004 | Lee et al. |
| 6,692,717 B1 | 2/2004 | Smalley et al. |
| 6,765,949 B2 | 7/2004 | Chang |
| 6,790,425 B1 | 9/2004 | Smalley et al. |
| 6,818,821 B2 | 11/2004 | Fujieda et al. |
| 6,837,928 B1 | 1/2005 | Zhang et al. |
| 6,852,410 B2 | 2/2005 | Veedu et al. |
| 6,863,942 B2 | 3/2005 | Ren et al. |
| 6,887,451 B2 | 5/2005 | Dodelet et al. |
| 6,900,264 B2 | 5/2005 | Kumar et al. |
| 6,900,580 B2 | 5/2005 | Dai et al. |
| 6,908,572 B1 | 6/2005 | Derbyshire et al. |
| 6,913,075 B1 | 7/2005 | Knowles et al. |
| 6,934,600 B2 | 8/2005 | Jang et al. |
| 6,936,653 B2 | 8/2005 | McElrath et al. |
| 6,955,800 B2 | 10/2005 | Resasco et al. |
| 6,962,892 B2 | 11/2005 | Resasco et al. |
| 6,967,013 B2 | 11/2005 | Someya et al. |
| 6,979,709 B2 | 12/2005 | Smalley et al. |
| 6,986,853 B2 | 1/2006 | Glatkowski et al. |
| 6,986,877 B2 | 1/2006 | Takikawa et al. |
| 6,994,907 B2 | 2/2006 | Resasco et al. |
| 7,011,760 B2 | 3/2006 | Wang et al. |
| 7,018,600 B2 | 3/2006 | Yanagisawa et al. |
| 7,022,776 B2 | 4/2006 | Bastiaens et al. |
| 7,045,108 B2 | 5/2006 | Jiang et al. |
| 7,056,452 B2 | 6/2006 | Niu et al. |
| 7,074,294 B2 | 7/2006 | Dubrow |
| 7,094,386 B2 | 8/2006 | Resasco et al. |
| 7,105,596 B2 | 9/2006 | Smalley et al. |
| 7,108,841 B2 | 9/2006 | Smalley et al. |
| 7,118,693 B2 | 10/2006 | Glatkowski et al. |
| 7,125,533 B2 | 10/2006 | Khabashesku et al. |
| 7,125,534 B1 | 10/2006 | Smalley et al. |
| 7,132,621 B2 | 11/2006 | Kumar et al. |
| 7,144,563 B2 | 12/2006 | Rao et al. |
| 7,148,619 B2 | 12/2006 | Den et al. |
| 7,151,129 B2 | 12/2006 | Ishikawa et al. |
| 7,153,452 B2 | 12/2006 | Ogale et al. |
| 7,157,068 B2 | 1/2007 | Li et al. |
| 7,160,531 B1 | 1/2007 | Jacques et al. |
| 7,160,532 B2 | 1/2007 | Liu et al. |
| 7,211,320 B1 | 5/2007 | Cooper et |
| 7,226,643 B2 | 6/2007 | Juang et al. |
| 7,235,159 B2 | 6/2007 | Gu et al. |
| 7,239,073 B2 | 7/2007 | Takikawa et al. |
| 7,253,442 B2 | 8/2007 | Huang et al. |
| 7,261,779 B2 | 8/2007 | Gardner |
| 7,265,174 B2 | 9/2007 | Carroll et al. |
| 7,265,175 B2 | 9/2007 | Winey et al. |
| 7,278,324 B2 | 10/2007 | Smits et al. |
| 7,294,302 B2 | 11/2007 | Koide et al. |
| 7,329,698 B2 | 2/2008 | Noguchi et al. |
| 7,338,684 B1 | 3/2008 | Curliss et al. |
| 7,354,881 B2 | 4/2008 | Resasco et al. |
| 7,354,988 B2 | 4/2008 | Charati et al. |
| 7,372,880 B2 | 5/2008 | Jablonski et al. |
| 7,384,663 B2 | 6/2008 | Olry et al. |
| 7,399,794 B2 | 7/2008 | Harmon et al. |

(56) References Cited

U.S. PATENT DOCUMENTS

| | | |
|---|---|---|
| 7,407,640 B2 | 8/2008 | Barrera et al. |
| 7,407,901 B2 | 8/2008 | Bystricky et al. |
| 7,410,628 B2 | 8/2008 | Bening et al. |
| 7,419,601 B2 | 9/2008 | Cooper et al. |
| 7,431,965 B2 | 10/2008 | Grigorian et al. |
| 7,445,817 B2 | 11/2008 | Kumar et al. |
| 7,448,441 B2 | 11/2008 | Hendricks et al. |
| 7,448,931 B2 | 11/2008 | Liu et al. |
| 7,459,627 B2 | 12/2008 | Lee et al. |
| 7,465,605 B2 | 12/2008 | Raravikar et al. |
| 7,473,466 B1 | 1/2009 | Muradov |
| 7,479,052 B2 | 1/2009 | Kim et al. |
| 7,488,455 B2 | 2/2009 | Dai et al. |
| 7,494,639 B2 | 2/2009 | Marek et al. |
| 7,504,078 B1 | 3/2009 | Jacques et al. |
| 7,510,695 B2 | 3/2009 | Smalley et al. |
| 7,534,486 B2 | 5/2009 | Boerstoel et al. |
| 7,563,411 B2 | 7/2009 | Jiang et al. |
| 7,563,428 B2 | 7/2009 | Resasco et al. |
| 7,569,425 B2 | 8/2009 | Huang et al. |
| 7,588,700 B2 | 9/2009 | Kwon et al. |
| 7,592,248 B2 | 9/2009 | Ventzek et al. |
| 7,597,869 B2 | 10/2009 | Hsiao |
| 7,608,798 B2 | 10/2009 | Kumar et al. |
| 7,611,579 B2 | 11/2009 | Lashmore et al. |
| 7,615,204 B2 | 11/2009 | Ajayan et al. |
| 7,615,205 B2 | 11/2009 | Jiang et al. |
| 7,632,550 B2 | 12/2009 | Mizuno et al. |
| 7,632,569 B2 | 12/2009 | Smalley et al. |
| 7,656,027 B2 | 2/2010 | Dangelo et al. |
| 7,666,915 B2 | 2/2010 | Zhang et al. |
| 7,687,981 B2 | 3/2010 | Parsapour |
| 7,700,943 B2 | 4/2010 | Raravikar et al. |
| 7,709,087 B2 | 5/2010 | Majidi et al. |
| 7,718,220 B2 | 5/2010 | D'Silva et al. |
| 7,771,798 B1 | 8/2010 | Grosse et al. |
| 7,776,777 B2 | 8/2010 | Kim et al. |
| 7,811,632 B2 | 10/2010 | Eres |
| 7,815,820 B2 | 10/2010 | Tan et al. |
| 7,816,709 B2 | 10/2010 | Balzano et al. |
| 7,862,795 B2 | 1/2011 | Zhang et al. |
| 7,871,591 B2 | 1/2011 | Harutyunyan et al. |
| 7,880,376 B2 | 2/2011 | Takai et al. |
| 7,927,701 B2 | 4/2011 | Curliss et al. |
| 8,148,276 B2 | 4/2012 | Nejhad et al. |
| 8,168,291 B2 | 5/2012 | Shah et al. |
| 2002/0035170 A1 | 3/2002 | Glatkowski et al. |
| 2002/0085968 A1 | 7/2002 | Smalley et al. |
| 2002/0102201 A1 | 8/2002 | Colbert et al. |
| 2002/0197474 A1 | 12/2002 | Reynolds |
| 2003/0024884 A1 | 2/2003 | Petrik |
| 2003/0042147 A1 | 3/2003 | Talin et al. |
| 2003/0068432 A1 | 4/2003 | Dai et al. |
| 2003/0102585 A1 | 6/2003 | Poulin et al. |
| 2003/0111333 A1 | 6/2003 | Montgomery et al. |
| 2003/0157378 A1 | 8/2003 | Mizuno et al. |
| 2003/0175003 A1 | 9/2003 | Gasca et al. |
| 2004/0007955 A1 | 1/2004 | Yaniv et al. |
| 2004/0009115 A1 | 1/2004 | Wee et al. |
| 2004/0026234 A1 | 2/2004 | Vanden Brande et al. |
| 2004/0037767 A1 | 2/2004 | Adderton et al. |
| 2004/0079278 A1 | 4/2004 | Kamins et al. |
| 2004/0082247 A1 | 4/2004 | Desai et al. |
| 2004/0089237 A1 | 5/2004 | Pruett et al. |
| 2004/0105807 A1 | 6/2004 | Fan et al. |
| 2004/0173506 A1 | 9/2004 | Doktycz et al. |
| 2004/0184981 A1 | 9/2004 | Liu et al. |
| 2004/0194707 A1 | 10/2004 | Takahashi et al. |
| 2004/0245088 A1 | 12/2004 | Gardner |
| 2004/0247808 A1 | 12/2004 | Cooper et al. |
| 2004/0253167 A1 | 12/2004 | Silva et al. |
| 2005/0009694 A1 | 1/2005 | Watts et al. |
| 2005/0026778 A1 | 2/2005 | Axtell et al. |
| 2005/0090176 A1 | 4/2005 | Dean et al. |
| 2005/0093458 A1 | 5/2005 | Babayan et al. |
| 2005/0100501 A1 | 5/2005 | Veedu et al. |
| 2005/0112052 A1 | 5/2005 | Gu et al. |
| 2005/0119105 A1 | 6/2005 | Zimmer et al. |
| 2005/0119371 A1 | 6/2005 | Drzal et al. |
| 2005/0147553 A1 | 7/2005 | Wong et al. |
| 2005/0164169 A1 | 7/2005 | Malak |
| 2005/0170089 A1 | 8/2005 | Lashmore et al. |
| 2005/0172370 A1 | 8/2005 | Haq et al. |
| 2005/0176329 A1 | 8/2005 | Olry et al. |
| 2005/0188727 A1 | 9/2005 | Greywall |
| 2005/0191490 A1 | 9/2005 | Ton-That et al. |
| 2005/0215164 A1 | 9/2005 | Mueller et al. |
| 2005/0238566 A1 | 10/2005 | Rao et al. |
| 2005/0245622 A1 | 11/2005 | Beijense et al. |
| 2005/0260412 A1 | 11/2005 | Gardner |
| 2005/0263456 A1 | 12/2005 | Cooper et al. |
| 2005/0279274 A1 | 12/2005 | Niu et al. |
| 2005/0287064 A1 | 12/2005 | Mayne et al. |
| 2006/0002844 A1 | 1/2006 | Suenaga et al. |
| 2006/0052509 A1 | 3/2006 | Saitoh |
| 2006/0062944 A1 | 3/2006 | Gardner et al. |
| 2006/0067871 A1 | 3/2006 | Hart et al. |
| 2006/0083674 A1 | 4/2006 | Maruyama et al. |
| 2006/0083927 A1 | 4/2006 | Von Ehr |
| 2006/0104890 A1 | 5/2006 | Harutyunyan et al. |
| 2006/0108906 A1 | 5/2006 | Gosain et al. |
| 2006/0110599 A1 | 5/2006 | Honma et al. |
| 2006/0121275 A1 | 6/2006 | Poulin et al. |
| 2006/0134329 A1 | 6/2006 | Wei et al. |
| 2006/0159916 A1 | 7/2006 | Dubrow et al. |
| 2006/0165914 A1 | 7/2006 | Abrahamson |
| 2006/0166003 A1 | 7/2006 | Khabashesku et al. |
| 2006/0172179 A1 | 8/2006 | Gu et al. |
| 2006/0177602 A1 | 8/2006 | Dijon et al. |
| 2006/0198956 A1 | 9/2006 | Eres |
| 2006/0205304 A1 | 9/2006 | Marzolin et al. |
| 2006/0239894 A1 | 10/2006 | Kurachi et al. |
| 2007/0009421 A1 | 1/2007 | Kittrell et al. |
| 2007/0020167 A1 | 1/2007 | Han et al. |
| 2007/0035226 A1 | 2/2007 | Ganapathiraman et al. |
| 2007/0048521 A1 | 3/2007 | Istvan |
| 2007/0053824 A1 | 3/2007 | Subramanya et al. |
| 2007/0054105 A1 | 3/2007 | Hsiao |
| 2007/0090489 A1 | 4/2007 | Hart et al. |
| 2007/0092431 A1 | 4/2007 | Resasco et al. |
| 2007/0099527 A1 | 5/2007 | Brun et al. |
| 2007/0103048 A1 | 5/2007 | Liu et al. |
| 2007/0104892 A1 | 5/2007 | Ishida et al. |
| 2007/0110977 A1 | 5/2007 | Al-Haik et al. |
| 2007/0128960 A1 | 6/2007 | Ghasemi Nejhad et al. |
| 2007/0135588 A1 | 6/2007 | Diakoumakos et al. |
| 2007/0141114 A1 | 6/2007 | Muisener et al. |
| 2007/0148340 A1 | 6/2007 | Kalkanoglu et al. |
| 2007/0148429 A1 | 6/2007 | McGrath et al. |
| 2007/0183959 A1 | 8/2007 | Charlier et al. |
| 2007/0189953 A1 | 8/2007 | Bai et al. |
| 2007/0205394 A1 | 9/2007 | Furman et al. |
| 2007/0218280 A1 | 9/2007 | Yabuki et al. |
| 2007/0253890 A1 | 11/2007 | Nakayama et al. |
| 2007/0254488 A1 | 11/2007 | Huotari et al. |
| 2007/0259128 A1 | 11/2007 | Parsapour |
| 2007/0298669 A1 | 12/2007 | Barrera et al. |
| 2008/0014431 A1 | 1/2008 | Lashmore et al. |
| 2008/0017845 A1 | 1/2008 | Drndic et al. |
| 2008/0020193 A1 | 1/2008 | Jang et al. |
| 2008/0023396 A1 | 1/2008 | Fugetsu |
| 2008/0048364 A1 | 2/2008 | Armeniades et al. |
| 2008/0053922 A1 | 3/2008 | Honsinger et al. |
| 2008/0069760 A1 | 3/2008 | O'Brien et al. |
| 2008/0075954 A1* | 3/2008 | Wardle .................. B82B 1/00 428/339 |
| 2008/0118753 A1 | 5/2008 | Poulin et al. |
| 2008/0135815 A1 | 6/2008 | Glatkowski et al. |
| 2008/0155888 A1 | 7/2008 | Vick et al. |
| 2008/0160286 A1 | 7/2008 | Asrar et al. |
| 2008/0160302 A1 | 7/2008 | Asrar et al. |
| 2008/0164801 A1 | 7/2008 | Min et al. |
| 2008/0170982 A1 | 7/2008 | Zhang et al. |
| 2008/0178924 A1 | 7/2008 | Kempa et al. |

(56) References Cited

U.S. PATENT DOCUMENTS

| | | |
|---|---|---|
| 2008/0182108 A1 | 7/2008 | Curliss et al. |
| 2008/0187648 A1 | 8/2008 | Hart et al. |
| 2008/0213498 A1 | 9/2008 | Drzal et al. |
| 2008/0247938 A1 | 10/2008 | Tsai et al. |
| 2008/0247939 A1 | 10/2008 | Iyuke |
| 2008/0274036 A1 | 11/2008 | Resasco et al. |
| 2008/0279753 A1 | 11/2008 | Harutyunyan |
| 2008/0280031 A1 | 11/2008 | Drzal et al. |
| 2008/0280136 A1 | 11/2008 | Zachariah |
| 2008/0286564 A1 | 11/2008 | Tsotsis |
| 2008/0287598 A1 | 11/2008 | Lee |
| 2008/0290787 A1 | 11/2008 | Cok |
| 2008/0305329 A1 | 12/2008 | D'Silva et al. |
| 2008/0308209 A1 | 12/2008 | Loutfy et al. |
| 2009/0017301 A1 | 1/2009 | Moireau |
| 2009/0020734 A1 | 1/2009 | Jang et al. |
| 2009/0021136 A1 | 1/2009 | Coll et al. |
| 2009/0047453 A1 | 2/2009 | Folaron et al. |
| 2009/0047502 A1 | 2/2009 | Folaron et al. |
| 2009/0068387 A1 | 3/2009 | Panzer et al. |
| 2009/0068461 A1 | 3/2009 | Reneker et al. |
| 2009/0072222 A1 | 3/2009 | Radisic et al. |
| 2009/0081383 A1 | 3/2009 | Alberding et al. |
| 2009/0081441 A1 | 3/2009 | Shah et al. |
| 2009/0092832 A1 | 4/2009 | Moireau |
| 2009/0099016 A1 | 4/2009 | Carruthers et al. |
| 2009/0116798 A1 | 5/2009 | Blanchandin et al. |
| 2009/0121219 A1 | 5/2009 | Song et al. |
| 2009/0126783 A1 | 5/2009 | Lin et al. |
| 2009/0136707 A1 | 5/2009 | Ueno |
| 2009/0140098 A1 | 6/2009 | Lengsfeld et al. |
| 2009/0155451 A1 | 6/2009 | Ylitalo et al. |
| 2009/0176100 A1 | 7/2009 | Higashi et al. |
| 2009/0176112 A1 | 7/2009 | Kruckenberg et al. |
| 2009/0186214 A1 | 7/2009 | Lafdi et al. |
| 2009/0191352 A1 | 7/2009 | Dufaux et al. |
| 2009/0192241 A1 | 7/2009 | Raravikar et al. |
| 2009/0202422 A1 | 8/2009 | Kajiura et al. |
| 2009/0212430 A1 | 8/2009 | Wyland |
| 2009/0214800 A1 | 8/2009 | Saito |
| 2009/0220409 A1* | 9/2009 | Curliss .................... B01J 6/008 423/447.2 |
| 2009/0258164 A1 | 10/2009 | Nakai et al. |
| 2009/0286079 A1 | 11/2009 | Barker et al. |
| 2009/0294753 A1 | 12/2009 | Hauge et al. |
| 2009/0311166 A1 | 12/2009 | Hart et al. |
| 2009/0311168 A1 | 12/2009 | Duvall |
| 2009/0318614 A1 | 12/2009 | Chevalier |
| 2009/0325377 A1 | 12/2009 | DiJon et al. |
| 2010/0000770 A1 | 1/2010 | Gupta et al. |
| 2010/0059243 A1 | 3/2010 | Chang |
| 2010/0074834 A1 | 3/2010 | Kim |
| 2010/0081769 A1 | 4/2010 | Ma |
| 2010/0092841 A1 | 4/2010 | Lopez et al. |
| 2010/0098931 A1 | 4/2010 | Daniel et al. |
| 2010/0099319 A1 | 4/2010 | Lashmore et al. |
| 2010/0117764 A1 | 5/2010 | Wang et al. |
| 2010/0159240 A1 | 6/2010 | Shah et al. |
| 2010/0178825 A1 | 7/2010 | Shah et al. |
| 2010/0188833 A1 | 7/2010 | Liang et al. |
| 2010/0192851 A1 | 8/2010 | Shah et al. |
| 2010/0196697 A1 | 8/2010 | D'Silva et al. |
| 2010/0197848 A1 | 8/2010 | Verghese et al. |
| 2010/0200208 A1 | 8/2010 | Cola et al. |
| 2010/0206504 A1 | 8/2010 | Akiyama et al. |
| 2010/0210159 A1 | 8/2010 | Zhu |
| 2010/0221424 A1 | 9/2010 | Malecki et al. |
| 2010/0224129 A1 | 9/2010 | Malecki et al. |
| 2010/0227134 A1 | 9/2010 | Shah et al. |
| 2010/0254885 A1 | 10/2010 | Menchhofer et al. |
| 2010/0260931 A1 | 10/2010 | Malecki et al. |
| 2010/0260933 A1 | 10/2010 | Malecki et al. |
| 2010/0260998 A1 | 10/2010 | Waicukauski et al. |
| 2010/0261058 A1 | 10/2010 | Lopatin et al. |
| 2010/0271253 A1 | 10/2010 | Shah et al. |
| 2010/0272891 A1 | 10/2010 | Malecki et al. |
| 2010/0276072 A1 | 11/2010 | Shah et al. |
| 2010/0279569 A1 | 11/2010 | Shah et al. |
| 2010/0311866 A1 | 12/2010 | Huang et al. |
| 2011/0014446 A1 | 1/2011 | Saito |
| 2011/0024409 A1 | 2/2011 | Shah et al. |
| 2011/0024694 A1 | 2/2011 | Shah et al. |
| 2011/0132245 A1 | 6/2011 | Shah et al. |
| 2011/0186775 A1 | 8/2011 | Shah et al. |
| 2011/0203927 A1 | 8/2011 | Draper et al. |
| 2011/0241244 A1 | 10/2011 | Liu |
| 2011/0242731 A1 | 10/2011 | Fleischer et al. |
| 2011/0256336 A1 | 10/2011 | Koike |
| 2012/0065300 A1 | 3/2012 | Shah et al. |
| 2012/0070667 A1 | 3/2012 | Malet et al. |
| 2012/0122020 A1 | 5/2012 | Hata et al. |
| 2012/0247800 A1 | 10/2012 | Shah et al. |
| 2012/0251432 A1 | 10/2012 | Cooper et al. |

FOREIGN PATENT DOCUMENTS

| | | |
|---|---|---|
| CN | 1379740 A | 11/2002 |
| CN | 1418260 A | 5/2003 |
| CN | 1477260 A | 2/2004 |
| CN | 1502553 A | 6/2004 |
| CN | 1504407 A | 6/2004 |
| CN | 1558441 A | 12/2004 |
| CN | 1696337 A | 11/2005 |
| CN | 1826286 A | 8/2006 |
| CN | 1919727 A | 2/2007 |
| CN | 101012621 A | 8/2007 |
| CN | 101049927 A | 10/2007 |
| CN | 101070250 A | 11/2007 |
| CN | 101095230 A | 12/2007 |
| CN | 101173386 A | 5/2008 |
| CN | 101177803 A | 5/2008 |
| CN | 101365830 A | 2/2009 |
| CN | 101372327 A | 2/2009 |
| CN | 101372329 A | 2/2009 |
| CN | 101378988 A | 3/2009 |
| CN | 101541860 A | 9/2009 |
| CN | 101698975 A | 4/2010 |
| CN | 101746717 A | 6/2010 |
| EP | 0098315 A1 | 1/1984 |
| EP | 1637828 A2 | 3/2006 |
| EP | 1939149 A2 | 7/2008 |
| GB | 2399092 A | 9/2004 |
| GB | 2458776 A | 10/2009 |
| IN | 01900DE2008 | 8/2008 |
| JP | 60-027700 | 2/1985 |
| JP | 01-283376 | 11/1989 |
| JP | H04-334823 A | 11/1992 |
| JP | 08-192044 A | 7/1996 |
| JP | 09-012343 | 1/1997 |
| JP | H11-139815 A | 5/1999 |
| JP | 2000-058158 A | 2/2000 |
| JP | 2000-309870 A | 11/2000 |
| JP | 2002-115071 A | 4/2002 |
| JP | 2003-502507 A | 1/2003 |
| JP | 2003-171108 A | 6/2003 |
| JP | 2003-239171 A | 8/2003 |
| JP | 2004-002182 A | 1/2004 |
| JP | 2004-015600 A | 1/2004 |
| JP | 2004-059428 A | 2/2004 |
| JP | 2004-261875 A | 9/2004 |
| JP | 2004-265600 A | 9/2004 |
| JP | 2004-284919 A | 10/2004 |
| JP | 2004-284921 A | 10/2004 |
| JP | 2004-327085 A | 11/2004 |
| JP | 2005-162571 A | 6/2005 |
| JP | 2005-213700 A | 8/2005 |
| JP | 2006-007213 A | 1/2006 |
| JP | 2006-026533 A | 2/2006 |
| JP | 2006-057231 A | 3/2006 |
| JP | 2006-069816 A | 3/2006 |
| JP | 2006-255817 A | 9/2006 |
| JP | 2006-342011 A | 12/2006 |
| JP | 2007-091556 A | 4/2007 |
| JP | 2007-117881 A | 5/2007 |

(56) References Cited

FOREIGN PATENT DOCUMENTS

| | | |
|---|---|---|
| JP | 2007-523033 A | 8/2007 |
| JP | 2007-523822 A | 8/2007 |
| JP | 2007-524774 A | 8/2007 |
| JP | 2007-230832 A | 9/2007 |
| JP | 2008-063196 A | 3/2008 |
| JP | 2008-063718 A | 3/2008 |
| JP | 2008-520429 A | 6/2008 |
| JP | 2008-535752 A | 9/2008 |
| JP | 2008-535763 A | 9/2008 |
| JP | 2008-266057 A | 11/2008 |
| JP | 2008-296338 A | 12/2008 |
| JP | 2008-544939 A | 12/2008 |
| JP | 2009-021038 A | 1/2009 |
| JP | 2009-517531 A | 4/2009 |
| JP | 2009-215146 A | 9/2009 |
| JP | 2009-535530 A | 10/2009 |
| JP | 2009-537439 A | 10/2009 |
| JP | 2011-071049 A | 4/2011 |
| JP | 2012-503128 A | 2/2012 |
| KR | 100829001 B1 | 5/2008 |
| TW | 2090833861 | 8/2008 |
| TW | 201217827 A | 5/2012 |
| WO | WO-99/58756 | 11/1999 |
| WO | WO-01/39970 | 6/2001 |
| WO | WO-03/082733 A2 | 10/2003 |
| WO | WO-2004/071654 A1 | 8/2004 |
| WO | WO-2005/007564 A1 | 1/2005 |
| WO | WO-2005/012171 A2 | 2/2005 |
| WO | WO-2005/028174 A2 | 3/2005 |
| WO | WO-2005037470 A2 | 4/2005 |
| WO | WO-2005/044723 A2 | 5/2005 |
| WO | WO-2005/075341 A2 | 8/2005 |
| WO | WO-2006/048531 | 5/2006 |
| WO | WO-2006/064760 A1 | 6/2006 |
| WO | WO-2006/107144 | 10/2006 |
| WO | WO-2006/115486 | 11/2006 |
| WO | WO-2007/015710 A2 | 2/2007 |
| WO | WO-2007/020362 A2 | 2/2007 |
| WO | WO-2007/061854 A2 | 5/2007 |
| WO | WO-2007/089118 | 8/2007 |
| WO | WO-2007/130979 A2 | 11/2007 |
| WO | WO-2007/136755 A2 | 11/2007 |
| WO | WO-2007136613 A2 | 11/2007 |
| WO | WO-2007/149109 A2 | 12/2007 |
| WO | WO-2008/025750 A1 | 3/2008 |
| WO | WO 2008/041183 A2 | 4/2008 |
| WO | WO-2008/054541 A2 | 5/2008 |
| WO | WO-2008/060665 A2 | 5/2008 |
| WO | WO-2008/085634 | 7/2008 |
| WO | WO-2008/106143 A2 | 9/2008 |
| WO | WO-2008/115640 A2 | 9/2008 |
| WO | WO-2008/153609 | 12/2008 |
| WO | WO-2009/004346 | 1/2009 |
| WO | WO-2009/004348 A2 | 1/2009 |
| WO | WO-2009/008291 | 1/2009 |
| WO | WO-2009/027133 A2 | 3/2009 |
| WO | WO-2009/110885 | 9/2009 |
| WO | WO-2010/007163 A1 | 1/2010 |
| WO | WO-2010/081769 | 7/2010 |
| WO | WO-2010/087903 | 8/2010 |
| WO | WO-2010/129234 A2 | 11/2010 |
| WO | WO-2011/108492 A1 | 9/2011 |

OTHER PUBLICATIONS

"Conformal coating," The Free Dictionary by Farlex, last viewed Jan. 15, 2013, retrieved from <http://encyclopedia.thefreedictionary.com/conformal+coating>.
Rowell, et al., "Organic Solar Cells with Carbon Nanotube Network Electrodes," online Jun. 6, 2006, vol. 88, Iss 33, p. 233506.
Ago, et al., "Colloidal Solution of Metal nanoparticles as a Catalyst for Carbon Nanotube Growth," Proceedings Materials Research Society, Fall 2000, pp. A13.18.13.18.5, vol. 633, Materials Research Society.
Andrews, et al., "Continuous Production of Aliogned Carbon Nanotubes: A Step Closer to Commercial Realization," Chemical Physics Lettrs, Apr. 16, 1999, vol. 303, Iss 5-6, pp. 467-474.
Bradford, et al., "Electrical Conductivity Study of Carbon Nanotube yarns, 3-D Hybrids and their Composites," Journal of Composite Materials, pp. 1533-1545, vol. 42, No. 15, SAGE Productions, Los Angeles, London, New Delhi and Singapore.
Bubert, et al., "Basis analytical investigation of plasma-chemically modified carbon fibers," Spectrochimica Acta Part B, 2002, pp. 1601-1610, vol. 57, Elsevier Science B.V.
Chae, et al., "A comparison of reinforcement efficiency of various types of carbon nanotubes in polyacrylonitrile fiber," Polymer, Nov. 21, 2005, pp. 10925-10935, vol. 46, No. 24, Elsevier Ltd.
Che, et al., "Chemical Vapor Deposition Based Synthesis of Carbon Nanotubes and Nanofibers Using a Template Method," Chem Mater, 1998, pp. 260-267, vol. 10, American Chemical Society.
Chen, et al., "Pulsed electrodeposition of Pt nanoclusters on carbon nanotubes modified carbon materials using diffusion restricting viscous electrolytes," Electrochemistry Communications, Jun. 2007, pp. 1348-1354, vol. 9, Elsevier B.V.
Chen, et al., "Basalt fiber-epoxy laminates with functionalized multi-walled carbon nanotubes," Composites, Part A 2009, pp. 1082-1089 vol. 40, Elsevier Ltd.
Ci, et al., "Direct growth of carbon nanotubes on the surface of ceramic fibers," Carbon, Jan. 2005, vol. 43, No. 4, pp. 883-886.
Definition of nanoparticle provided by Dictionary.com <http://dictionary.reference/.com/browse/nanoparticle>, accessed Nov. 2, 2012.
Emmenegger, et al., "Synthesis of Carbon Nanotubes over Fe Catalyst on Aluminum and Suggested Growth Mechanism," Carbon 2003, vol. 41, pp. 539-547.
Franz, et al., "Carbon Single-Wall nanotube Growth in a Volumetrically Confined Arc Discharge System," U.S. Department of Energy Journal of Undergraduate Research, pp. 66-69, publication date unknown.
Garcia, et al., "Aligned Carbon Nanotube Reinforcement of Advanced Composite Ply Interfaces," 49th AIAA/ASCE/ASC Structures, Structural Dynamics, and Materials Conference, Apr. 7-10, 2008, Schaumburg, IL, MIT American Institute of Aeronautics and Astronautics, Inc.
Hart, et al., "Rapid Growth and Flow-Mediated Nucleation of Millimeter-Scale Aligned Carbon Nanotube Structures from a Thin-Film Catalyst," J of Physical Chemistry B, online Mar. 11, 2006, vol. 110, Iss 6, pp. 8250-8257.
Homma, et al., "Growth of Suspended Carbon Nanotube Networks on 100-nm Scale Silicon Pillars," Applied Physics Letters, Sep. 16, 2002, vol. 81, No. 12, pp. 2261-2263.
Hsu, et al., "Optical Absorption and Thermal Transport of Individual Suspended Carbon Nanotube Bundles," Nano Lett 2009, pp. 590-594, vol. 9, No. 2, American Chemical Society, Publication Date (Web): Jan. 13, 2009.
Huang, et al., "Growth of Large Periodic Arrays of Carbon Nanotubes," Applied Physics Letters, Jan. 20, 2003, vol. 82, No. 3, pp. 460-463.
Jiang, et al., "Carbon nanotube-coated solid phase microextraction metal fiber based on sol-gel technique," Journal of Chromatography A., May 29, 2009, pp. 4641-4647, vol. 1216, Elsevier B.V.
Jiang, et al., "Plasma-Enhanced Deposition of Silver Nanoparticles onto Polymer and Metal Surfaces for the generation of Antimicrobial Characteristics," Journal of Applied Polymer Science 2004, pp. 1411-1422, vol. 93, Wiley Periodicals, Inc.
Jung, et al., "Fabrication of radar absorbing structure (RAS) using GFR-nano composite and spring-back compensation of hybrid composite RAS shells," Composite Structures 2006, pp. 571-576, vol. 75, Elsevier Ltd.
Keyvani, "Huge Opportuinities for Industry of Nanofibrous Concrete Technology," International Journal of Nanoscience and Nanotechnology, vol. 3, No. 1, Dec. 2007, pp. 1-11.
Kim, et al., "Processing, characterization and modeling of carbon nanotube-reinforced multiscale composites," Composites Science and Technology 2009, pp. 335-342, vol. 69, Elsevier Ltd.

(56) References Cited

OTHER PUBLICATIONS

Kim, et al., "Vertical Alignment of Printed Carbon Nanotubes by Multiple Field Emission Cycles," Applied Physics Letters, online Jun. 17, 2004, vol. 84, No. 26, pp. 5350-5352.

Kind, et al., "Patterned Films of Nanotubes Using Microcontact Printing of Catalysts," Adv Mater 1999, pp. 1285-1289, vol. 11, No. 15, WILEY-VCH Verlag GmbH.

Kramer, et al., "Constrained Iron Catalysts for Single-Walled Carbon Nanotube Growth," Langmuir 2005, 21, 8466-8470, <http://pubs.acs.org/dol/abs/10.1021/la0506729>.

Laachachi, et al., "A chemical method to graft carbon nanotubes onto a carbon fiber," materials Letters 2008, pp. 394-397, vol. 62, Elsevier B.V.

Lee, "Syntheses and properties of fluorinated carbon materials," Journal of Fluorine Chemistry 2007, pp. 392-403, vol. 128, Elsevier B.V.

Lee, et al., "Fabrication and design of multi-layered radar absorbing structures of MWNT-filed glass/epoxy plain-weave composites," Composite Structures 2006, pp. 397-405, vol. 76, Elsevier Ltd.

Li, et al., "A Miniature glucose/O2 biofuel cell with single-walled carbon nanotubes-modified carbon fiber microelectrodes as the substrate," Electrochemistry Communications, Jun. 2008, pp. 851-854, vol. 10, Elsevier B.V.

Li, et al., "Electromagnetic Interference (EMI) Shielding of Single-Walled Carbon Nanotube Epoxy Composites," Nano Lett 2006, pp. 1141-1145, vol. 6, No. 6, American Chemical Society.

Makris, et al., "Carbon Nanotubes Growth and Anchorage to Carbon Fibres," Carbon Nanotubes 2006, pp. 57-58, vol. 222, Springer, the Netherlands.

Mayya, et al., "Diameter Controlled Synthesis of Carbon Nanotubes by CVD Using Steric-Stabilized Nanoparticle Catalysts", NSTI-Nanotech, 2006, vol. 1, pp. 98-101.

Meyyappan, et al., "Carbon nanotube growth by PECVD: a review," Plasma Sources Sci Technol 2003, 205-216, vol. 12, IOP Publishing Ltd, UK.

Mylvaganam, "Fabrication and Application of Polymer Composites Comprising Carbon Nanotubes," Recent Pat nanotechnol 2007, pp. 59-65, vol. 1, Bentham Science Publishers.

Panhuis, et al., "Carbon Nanotube Mediated Reduction in Optical Activity in Polyaniline Composite Materials," J. Phys Chem C 2008, pp. 1441-1445, vol. 112, American Chemical Society.

Pisco, et al., "Hollow fibers integrated with single walled carbon nanotubes: Bandgap modification and chemical sensing capability," Sensors and Actuators B 2008, 163-170, vol. 129, Elsevier B.V.

Qu, et al., "Carbon Microfibers Sheathed with Aligned Carbon Nanotubes: Towards Multidimensional Multicomponent and Multifunctional Nanomaterials," SMALL, 2006, pp. 1052-1059, vol. 2, No. 8-9.

Rackauskas, "Carbon nanotube growth and use in energy sector," Energetika 2006, pp. 43-46, vol. 2.

Satishkumar, et al., "Bundles of aligned carbon nanotubes obtained by the pyrolysis of ferrocene-hydrocarbon mixtures: role of the metal nanoparticles produced in situ," Chemical Physical Letters 1999, pp. 158-162, vol. 307, Elsevier Science B.V.

Schmidt, et al., "Thin Solid Films Roll Up into Nanotubes," Nature, Mar. 8, 2001, vol. 410 No. 6825, p. 168.

Singh, et al. "Production of Controlled Architectures of Aligned Carbon Nanotubes by an Injection Chemical Vapour Deposition Method," Carbon, online Dec. 7, 2002, vol. 41, Iss 2, pp. 359-368.

Suh, et al., "Highly ordered two-dimensional carbon nanotube arrays," Applied Physics Letters, Oct. 4, 2002, pp. 2047-2049, vol. 75, No. 14, American Institute of Physics.

Thostenson, et al., "Carbon nanotube/carbon fiber hybrid multiscale composites," J Appl Phys 2002, pp. 6034-6037, vol. 91, No. 9, American Institute of Physics.

Wang, et al., "Penetration depth of atmospheric pressure plasma surface modification into multiple layers of polyester fabrics," Surface and Coating Technology 2007, pp. 77-83, vol. 202, Elsevier B.V.

Wang, et al., "Processing and property investigation of single-walled carbon nanotube (SWNT) buckypaper/epoxy resin matrix nanocomposites," Composites, Part A 2004, pp. 1225-1232, vol. 35, Elsevier Ltd.

Wichmann, et al., "Glass-fibre-reinforced composites with enhanced mechanical and electrical properties—Benefits and limitations of a nanoparticle modified matrix," Engineering Fracture Mechanics 2006, pp. 2346-2359, vol. 73, Elsevier Ltd.

Xu, et al., "Bone-shaped Nanomaterials for Nanocomposite Applications," Nano Lett 2003, pp. 1135-1139, vol. 3, No. 8, American Chemical Society.

Yabe, et al., "Synthesis of well-aligned carbon nanotubes by radio frequency plasma enhanced CVD method," Diamond and Related Materials 2004, pp. 1292-1295, vol. 13, Elsevier B.V.

Yamamoto, et al., "High-yield growth and morphology control of aligned carbon nanotubes on ceramic fibers for multifunctional enhancement of structural composites," Carbon, Mar. 2009, vol. 47, No. 3, pp. 551-560.

Yanagishita, et al., "Carbon Nanotubes with a Triangular Cross-=section, Fabricated Using Anodic Porous Alumina as the Temple," Adv Mater 2004, pp. 429-432, vol. 16, No. 5, WILEY-VCH Vertag GmbH.

Yang, et al., "Electrical Conductivity and Electromagnetic Interference Shielding of Multi-walled Carbon Nanotube Filled Polymer Composites," Mater Res Soc Symp Proc 2005, pp. HH5.3.1-HJH.5.3.5 vol. 858E, Materials Research Society.

Yeh, et al., "Mechanical properties of phenolic-based nanocomposites reinforced by multi-walled carbon nanotubes and carbon fibers," Composites; Part A 2008, pp. 677-684, vol. 39, No. 4.

Zhang et al., "Integration and characterization of aligned carbon nanotubes on metal/silicon substrates and effects of water", Applied Surface Science 255 (2009) 5003-5008.

Zhang, et al., "In situ growth of carbon nanotubes on inorganic fibers with different surface properties," Materials Chemisty and Physics 2008, pp. 317-321, vol. 107, Science direct.

Zhao, et al., "Growth of multi-walled carbon nanotubes with different morphologies on carbon fibers," Carbon 2005, pp. 651-673, vol. 43, Elsevier Ltd.

Zhao, et al., "The growth of multi-walled carbon nanotubes with different morphologies on carbon fibers," Carbon 2550, pp. 651-673, vol. 43, Elsevier Ltd.

Zhong, et al., "Growth Kinetics of 0.5 cm Vertically Aligned Single-Wealled Carbon Nanotubes," The Journal of Physical Chemistry B (Letters), Feb. 6, 2007, pp. 1907-1910, vol. 111, No. 8.

Zhu, et al., "Carbon nanotube growth on carbon fibers," Diamond and Related Materials 2003, p. 1825 vol. 12, Elsevier B.V.

Zhu, et al., "Synthesis of single walled carbon nanotubes by the vertical floating catalyst method," Chinese Science Bulletin 2002, pp. 159-162, vol. 47, No. 2.

Emmenegger,et al., "Carbon Nanotube Synthesized on Metallic Substrate," Applied Surface Science, 2000, pp. 452-456.

Hart, et al., "Desktop Growth of Carbon-Nanotube Monoliths with in Situ Optical Imaging", Small, 2007, pp. 772-777, vol. 3, No. 5.

Hasegawa, et al., "Millimeter-Tall Single-Walled Carbon Nanotubes Rapidly Grown with and without Water," ACS Nano, 2011, pp. 975-984, vol. 5, No. 2.

Medalia, et al., "Redox Recipes. I. Reaction between Ferrous Iron and Peroxides. General Considerations," Journal of Polymer Science, 1949, pp. 377-398, vol. IV.

Hart, et al., "Growth of conformal single-walled carbon nanotube films from MO/Fe/AL2O3 deposited by electron beam evaporation," Carbon (2006) vol. 44, pp. 348-359.

Hou, et al., "Carbon nanotubes formed on carbonized electrospun polymer nanofibers," Polymer Preprints, 2003, pp. 63-64, vol. 44, No. 2.

Callender, et al., "Aqueous Synthesis of Water-Soluble Alumoxanes: Environmentally Benign Precursors to Alumina and Aluminum-Based Ceramics," Chem. Mater. 1997, pp. 2418-2433, vol. 9.

Smith, Jr., "Nanocomposite Films Derived from Alkoxysilane Terminated Amide Acid Oligomers and Carbon Nanotubes," Mat. Res. Soc. Symp. Proc., 2002, pp. T3.5.1-T3.5.5, Vot 733E.

(56) References Cited

OTHER PUBLICATIONS

Lu, "Rheological Behavior of Carbon Nanotube-Alumina Nanoparticle Dispersion Systems," Powder Technology, 2007, pp. 154-161; vol. 177.

* cited by examiner

CNT-INFUSED METAL FIBER MATERIALS AND PROCESS THEREFOR

CROSS-REFERENCE TO RELATED APPLICATIONS

This application is a divisional of U.S. patent application Ser. No. 12/611,073, filed Nov. 2, 2009, which is a continuation-in-part of U.S. Pat. No. 8,158,217, filed on Jan. 3, 2007 and issued on Apr. 17, 2012. This application also claims the benefit of priority under 35 U.S.C. §119 from U.S. Provisional Application Nos. 61/168,516, filed Apr. 10, 2009; 61/169,055, filed Apr. 14, 2009; 61/155,935, filed Feb. 27, 2009; 61/157,096, filed Mar. 3, 2009; and 61/182,153, filed May 29, 2009, all of which are incorporated herein by reference in their entirety.

FIELD OF THE INVENTION

The present invention relates to fiber materials, more specifically to metal fiber materials modified with carbon nanotubes.

BACKGROUND OF THE INVENTION

Fiber materials are used for many different applications in a wide variety of industries, such as the commercial aviation, recreation, industrial and transportation industries. Commonly-used fiber materials for these and other applications include metal fiber, cellulosic fiber, carbon fiber, metal fiber, ceramic fiber and metal fiber, for example.

Metal fiber materials, in particular, are frequently used in composites to impart electrical conductivity. The use of high aspect ratio metal fibers with random orientation in the composite matrix material allows for low fiber loading while achieving good electrical conductivity. Such low level loadings, however, impart little benefit to the tensile strength of the composite, which is almost unchanged relative the parent matrix material. While increasing the loading of metal fiber might improve tensile strength, it can negatively impact the overall weight of the composite material.

It would be beneficial to provide an agent that allows the electrical conductivity properties of metal fiber materials to be realized in a composite while also enhancing the metal fiber-matrix material interface and, ultimately, the tensile strength of the composite material. The present invention satisfies this need and provides related advantages as well.

SUMMARY OF THE INVENTION

In some aspects, embodiments disclosed herein relate to a composition that includes a carbon nanotube (CNT)-infused metal fiber material which includes: a metal fiber material of spoolable dimensions, a barrier coating conformally disposed about the metal fiber material, and carbon nanotubes (CNTs) infused to the metal fiber material. The CNTs are uniform in length and uniform in distribution.

In some aspects, embodiments disclosed herein relate to a continuous CNT infusion process that includes: (a) disposing a barrier coating and a carbon nanotube (CNT)-forming catalyst on a surface of a metal fiber material of spoolable dimensions; and (b) synthesizing carbon nanotubes on the metal fiber material, thereby forming a carbon nanotube-infused metal fiber material.

DETAILED DESCRIPTION

Figure 1:
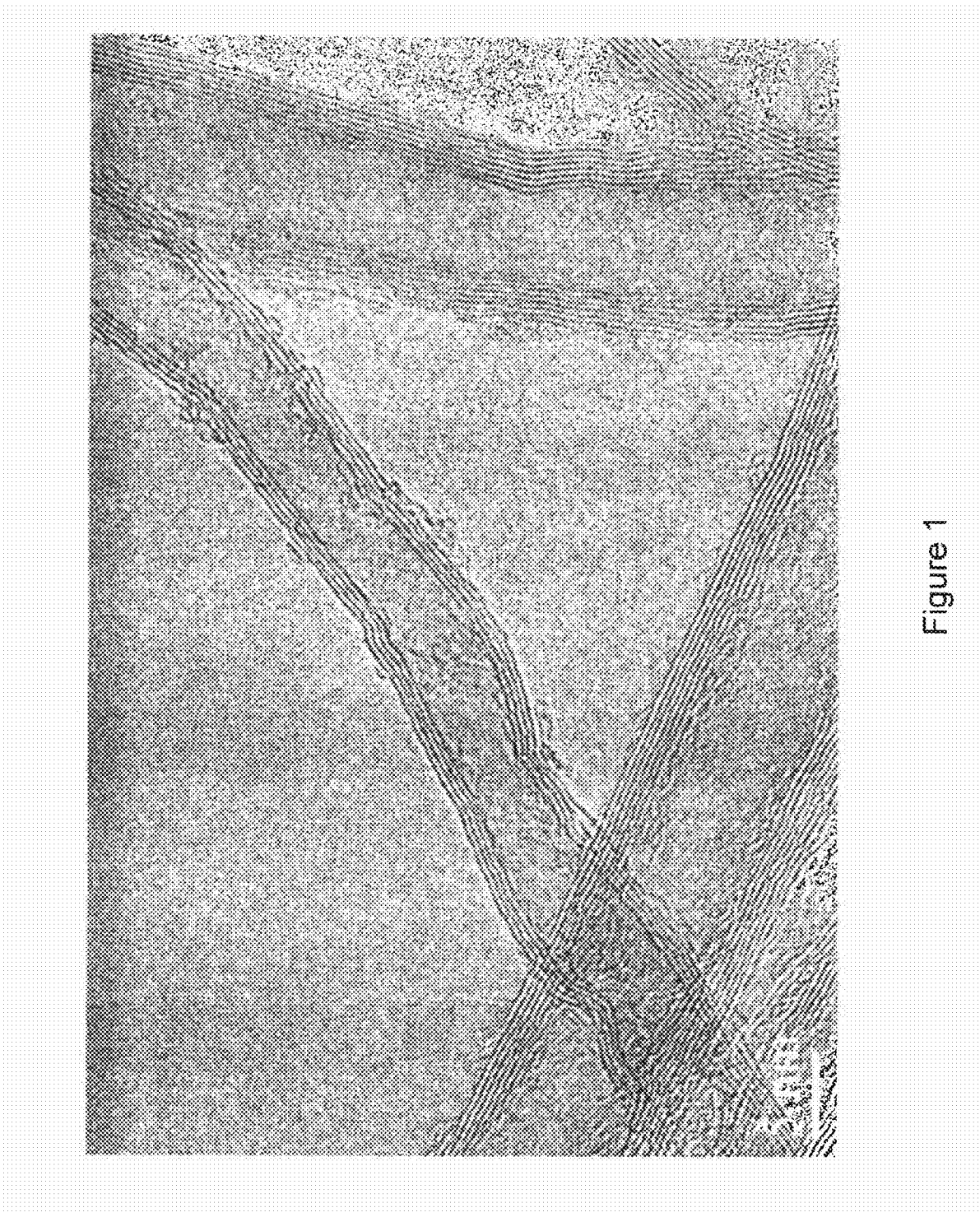
FIG. 1 shows a transmission electron microscope (TEM) image of multi-walled CNTs grown on a stainless steel mesh substrate.
Figure 2:
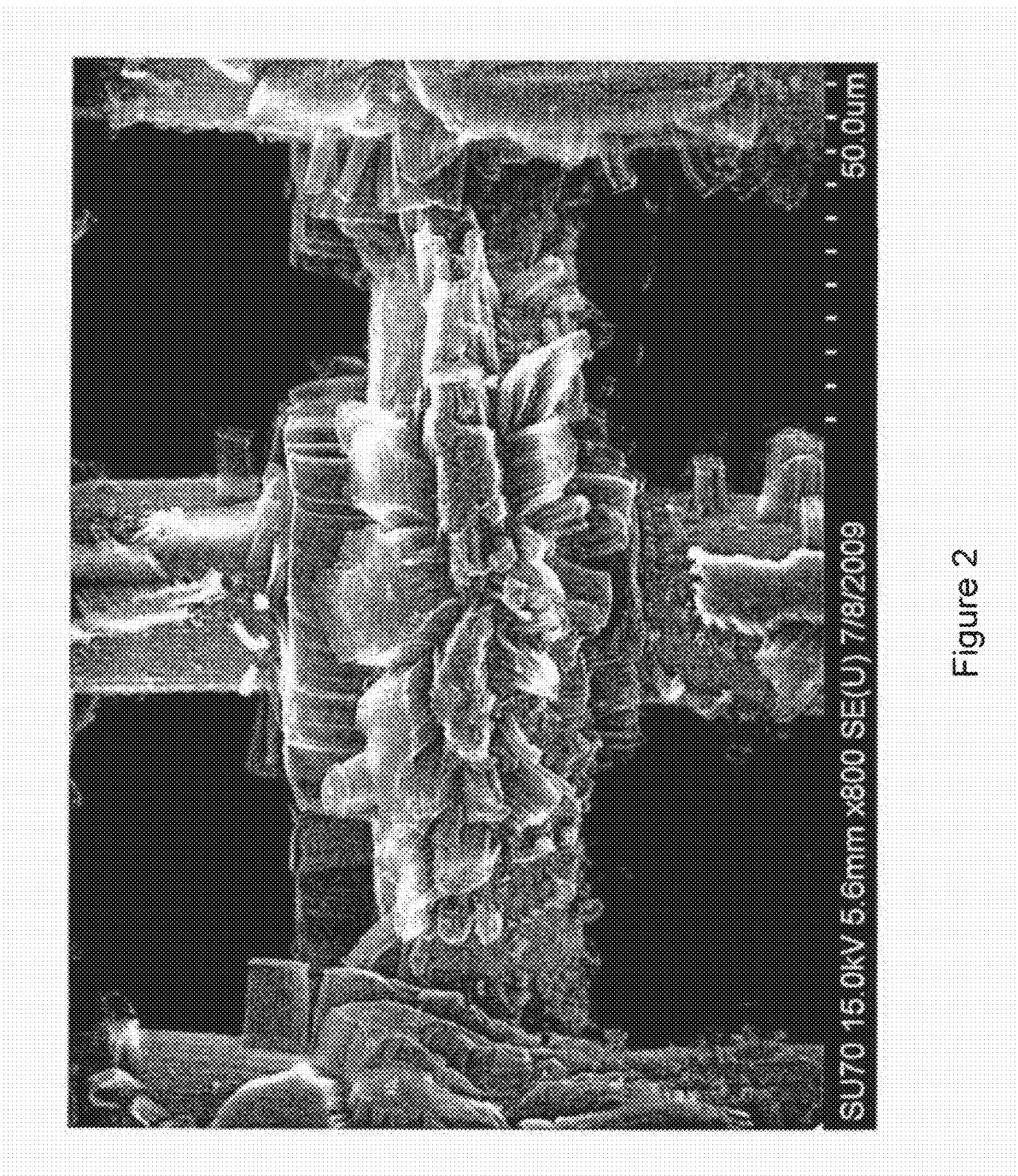
FIG. 2 shows a scanning electron microscope (SEM) image of 20 micron long CNTs grown on stainless steel mesh substrate.
Figure 3:
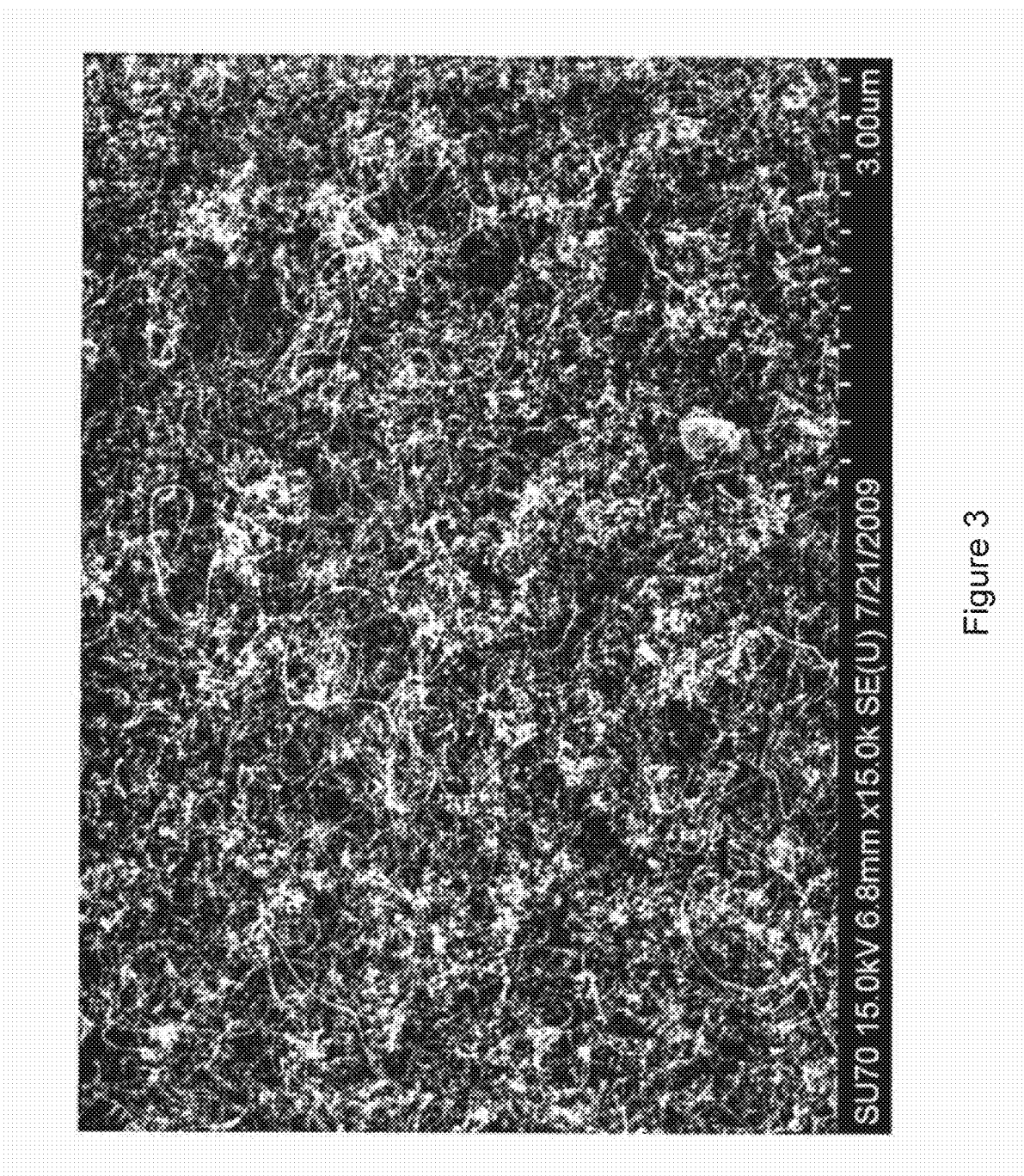
FIG. 3 shows an SEM image of about 1 micron long CNTs in a mat-like arrangement grown on stainless steel mesh, under high magnification.
Figure 4:
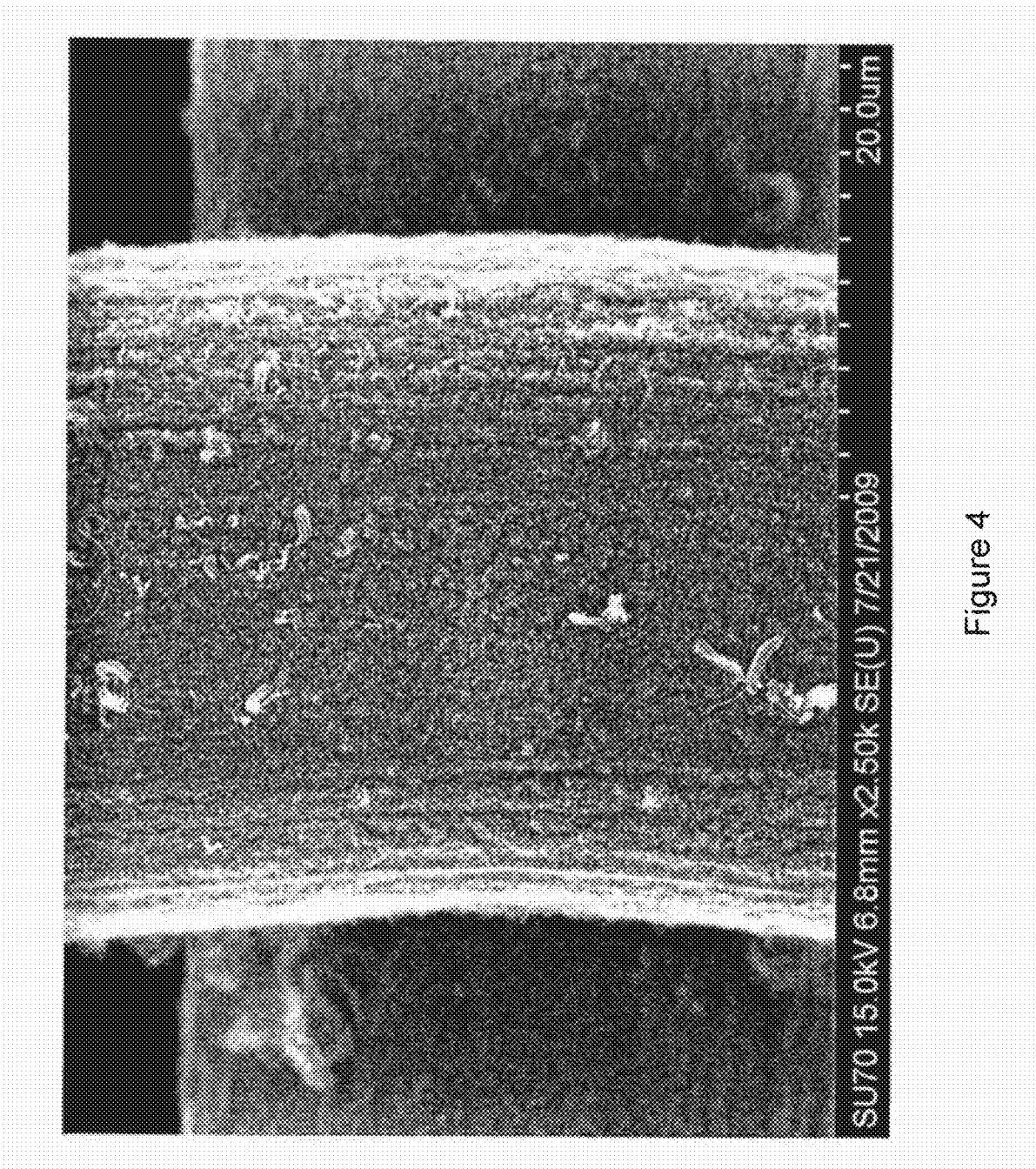
FIG. 4 shows an SEM image of about 1 micron long CNTs with a density of within 10% across a stainless steel mesh substrate.

The present disclosure is directed, in part, to carbon nanotube-infused ("CNT-infused") metal fiber materials. The infusion of CNTs to the metal fiber material can serve many functions including, for example, as a sizing agent that can interface between metal and a matrix material in a composite. The CNTs can also serve as one of several sizing agents coating the metal fiber material.

Moreover, CNTs infused on a metal fiber material can alter various properties of the metal fiber material, such as thermal and/or electrical conductivity, and/or tensile strength, for example. The processes employed to make CNT-infused metal fiber materials provide CNTs with substantially uniform length and distribution to impart their useful properties uniformly over the metal fiber material that is being modified. Furthermore, the processes disclosed herein are suitable for the generation of CNT-infused metal fiber materials of spoolable dimensions.

The present disclosure is also directed, in part, to processes for making CNT-infused metal fiber materials.

The processes described herein allow for the continuous production of carbon nanotubes of uniform length and distribution along spoolable lengths of tow, roving, tapes, fabrics, meshes, perforated metal sheets, solid metal sheets, and ribbons. While various mats, woven and non-woven fabrics and the like can be functionalized by processes of the invention, it is also possible to generate such higher ordered structures from the parent roving, tow, yarn or the like after CNT functionalization of these parent materials. For example, a CNT-infused chopped strand mat can be generated from a CNT-infused metal fiber roving. As used herein the term "metal fiber material" refers to any material which has metal fiber as its elementary structural component. The term encompasses, fibers, filaments, yarns, tows, tapes, woven and non-woven fabrics, plies, mats, and meshes.

As used herein the term "spoolable dimensions" refers to metal fiber materials having at least one dimension that is not limited in length, allowing for the material to be stored on a spool or mandrel. Metal fiber materials of "spoolable dimensions" have at least one dimension that indicates the use of either batch or continuous processing for CNT infusion as described herein. One metal fiber material of spoolable dimensions that is commercially available is exemplified by Stainless Steel metal fiber wire with a tex value of 8706 (1 tex=1 g/1,000 m) or 57 yard/lb (Mechanical Metals, Inc., Newton, Pa.). Commercial metal fiber roving, in particular, can be obtained on 1 oz, ¼, ½, 1, 5, 10, 25 lb, and greater spools, for example. Processes of the invention operate readily with 1 to 25 lb. spools, although larger spools are usable. Moreover, a pre-process operation can be incorporated that divides very large spoolable lengths, for example 100 lb. or more, into easy to handle dimensions, such as two 50 lb spools.

As used herein, the term "carbon nanotube" (CNT, plural CNTs) refers to any of a number of cylindrically-shaped allotropes of carbon of the fullerene family including single-walled carbon nanotubes (SWNTs), double-walled carbon nanotubes (DWNTS), multi-walled carbon nanotubes (MWNTs). CNTs can be capped by a fullerene-like structure or open-ended. CNTs include those that encapsulate other materials.

As used herein "uniform in length" refers to length of CNTs grown in a reactor. "Uniform length" means that the CNTs have lengths with tolerances of plus or minus about 20% of the total CNT length or less, for CNT lengths varying from between about 1 micron to about 500 microns. At very short lengths, such as 1-4 microns, this error may be in a range from between about plus or minus 20% of the total CNT length up to about plus or minus 1 micron, that is, somewhat more than about 20% of the total CNT length. Although uniformity in CNT length can be obtained across the entirety of any length of spoolable metal fiber material, processes of the invention also allow the CNT length to vary in discrete sections of any portion of the spoolable material. Thus, for example, a spoolable length of metal fiber material can have uniform CNT lengths within any number of sections, each section not necessarily having the same CNT length. Such sections of different CNT length can appear in any order and can optionally include sections that are void of CNTs. Such control of CNT length is made possible by varying the linespeed of the process, the flow rates of the carrier and carbon feedstock gases and reaction temperatures. All these variables in the process can be automated and run by computer control.

As used herein "uniform in distribution" refers to the consistency of density of CNTs on a metal fiber material. "Uniform distribution" means that the CNTs have a density on the metal fiber material with tolerances of plus or minus about 10% coverage defined as the percentage of the surface area of the fiber covered by CNTs. This is equivalent to ±1500 CNTs/µm$^2$ for an 8 nm diameter CNT with 5 walls. Such a figure assumes the space inside the CNTs as fillable.

As used herein, the term "infused" means bonded and "infusion" means the process of bonding. Such bonding can involve direct covalent bonding, ionic bonding, pi-pi, and/or van der Waals force-mediated physisorption. For example, CNTs may be infused directly to the metal fiber. Infusion can also involve indirect bonding, such as the indirect CNT infusion to the metal fiber via bonding to a barrier coating and/or an intervening transition metal nanoparticle disposed between the CNTs and metal fiber material. The particular manner in which a CNT is "infused" to a metal fiber material is referred to as a "bonding motif."

As used herein, the term "transition metal" refers to any element or alloy of elements in the d-block of the periodic table. The term "transition metal" also includes salt forms of the base transition metal element such as oxides, carbides, nitrides, and the like.

As used herein, the term "nanoparticle" or NP (plural NPs), or grammatical equivalents thereof refers to particles sized between about 0.1 to about 100 nanometers in equivalent spherical diameter, although the NPs need not be spherical in shape. Transition metal NPs, in particular, serve as catalysts for CNT growth on the metal fiber materials.

As used herein, the term "matrix material" refers to a bulk material than can serve to organize sized CNT-infused metal fiber materials in particular orientations, including random orientation. The matrix material can benefit from the presence of the CNT-infused metal fiber material by imparting some aspects of the physical and/or chemical properties of the CNT-infused metal fiber material to the matrix material.

As used herein, the term "material residence time" refers to the amount of time a discrete point along a glass fiber material of spoolable dimensions is exposed to CNT growth conditions during the CNT infusion processes described herein. This definition includes the residence time when employing multiple CNT growth chambers.

As used herein, the term "linespeed" refers to the speed at which a glass fiber material of spoolable dimensions can be fed through the CNT infusion processes described herein, where linespeed is a velocity determined by dividing CNT chamber(s) length by the material residence time.

In some embodiments, the present invention provides a composition that includes a carbon nanotube (CNT)-infused metal fiber material. The CNT-infused metal fiber material includes a metal fiber material of spoolable dimensions, a barrier coating conformally disposed about the metal fiber material, and carbon nanotubes (CNTs) infused to the metal fiber material. The infusion of CNTs to the metal fiber material can include a bonding motif of direct bonding of individual CNTs to a transition metal NP. The NPs, in turn, can be infused to the metal fiber material, the barrier coating, and mixtures thereof.

Without being bound by theory, transition metal NPs, which serve as a CNT-forming catalyst, can catalyze CNT growth by forming a CNT growth seed structure. The CNT-forming catalyst can remain at the base of the metal fiber material, locked by the barrier coating, and infused to the surface of the metal fiber material. In such a case, the seed structure initially formed by the transition metal nanoparticle catalyst is sufficient for continued non-catalyzed seeded CNT growth without the catalyst moving along the leading edge of CNT growth, as often observed in the art. In some embodiments, the CNT growth catalyst can follow the leading edge of the growing CNTs despite the presence of a barrier coating. In such embodiments, the CNT growth nanoparticle catalyst is disposed distal to the fiber and the CNT can infuse either directly to the metal fiber or to the barrier coating. In other embodiments, the nanoparticle serves as a point of attachment for the CNT to the metal fiber material. The presence of the barrier coating can also lead to further indirect bonding motifs. For example, the CNT forming catalyst can be locked into the barrier coating, as described above, but not in surface contact with metal fiber material. In such a case a stacked structure with the barrier coating disposed between the CNT forming catalyst and metal fiber material results. In either case, the CNTs formed are infused, albeit indirectly, to the metal fiber material. Regardless of the nature of the actual bonding motif formed between the carbon nanotubes and the metal fiber material, the infused CNT is robust and allows the CNT-infused metal fiber material to exhibit carbon nanotube properties and/or characteristics.

Again, without being bound by theory, when growing CNTs on metal fiber materials, the elevated temperatures and/or any residual oxygen and/or moisture that can be present in the reaction chamber can damage the metal fiber material, although standard measures to minimize such exposure are generally practiced. These issues can be considerable when the metal fiber material is a zero-valent metal that is vulnerable to oxidation. Moreover, the metal fiber material itself can be altered by reaction with the CNT-forming catalyst. That is the metal fiber material can form an alloy with the catalyst at the reaction temperatures employed for CNT synthesis. The CNT-forming nanoparticle catalysts are also vulnerable to high temperature sintering on the surface metal fiber material. This is because the surface structure of metals facilitates particle transport at the surface at the high temperatures employed in CNT synthesis. The barrier coating employed in the invention is designed to facilitate CNT synthesis on metal fiber materials, in addition to preventing sintering and/or alloying of the catalyst on the metal surface. Without being bound by theory, the barrier coating can provide a thermal barrier for use with low melting metal fiber material substrates such as zinc, aluminum, lead, and tin, for example. This thermal protection can also help reduce the formation of alloys. Furthermore, the barrier coating can also provide a physical barrier preventing sintering of the CNT-forming catalyst nanoparticles at the elevated temperatures by restricting movement of the catalyst nanoparticles on the surface of the metal fiber material. Additionally, the barrier coating can minimize the surface area contact between the CNT-forming catalyst and the metal fiber material and/or it can mitigate the effects of the exposure of the metal fiber material to the CNT-forming catalyst at CNT growth temperatures.

Compositions having CNT-infused metal fiber materials are provided in which the CNTs are substantially uniform in length. In the continuous process described herein, the residence time of the metal fiber material in a CNT growth chamber can be modulated to control CNT growth and ultimately, CNT length. This provides a means to control specific properties of the CNTs grown. CNT length can also be controlled through modulation of the carbon feedstock and carrier gas flow rates, and growth temperature. Additional control of the CNT properties can be obtained by controlling, for example, the size of the catalyst used to prepare the CNTs. For example, 1 nm transition metal nanoparticle catalysts can be used to provide SWNTs in particular. Larger catalysts can be used to prepare predominantly MWNTs.

Additionally, the CNT growth processes employed are useful for providing a CNT-infused metal fiber material with uniformly distributed CNTs on metal fiber materials while avoiding bundling and/or aggregation of the CNTs that can occur in processes in which pre-formed CNTs are suspended or dispersed in a solvent solution and applied by hand to the metal fiber material. Such aggregated CNTs tend to adhere weakly to a metal fiber material and the characteristic CNT properties are weakly expressed, if at all. In some embodiments, the maximum distribution density, expressed as percent coverage, that is, the surface area of fiber covered, can be as high as about 55%, assuming about 8 nm diameter CNTs with 5 walls. This coverage is calculated by considering the space inside the CNTs as being "fillable" space. Various distribution/density values can be achieved by varying catalyst dispersion on the surface as well as controlling gas composition, linespeed of the process, and reaction temperatures. Typically for a given set of parameters, a percent coverage within about 10% can be achieved across a metal fiber material surface. Higher density and shorter CNTs are useful for improving mechanical properties, while longer CNTs with lower density are useful for improving thermal and electrical properties, although increased density is still favorable. A lower density can result when longer CNTs are grown. This can be the result of employing higher temperatures and more rapid growth causing lower catalyst particle yields.

The compositions of the invention having CNT-infused metal fiber materials can include a metal fiber material such as a metal filament, a metal fiber yarn, a metal fiber tow, a metal tape, a metal fiber-braid, a woven metal fabric, a non-woven metal fiber mat, a metal fiber ply, meshes ribbons, solid metal sheets, and perforated metal sheets. Metal filaments include high aspect ratio fibers having diameters ranging in size from between about 10 microns to about 12.5 mm or greater. Metal fiber tows are generally compactly associated bundles of filaments and are usually twisted together to give ropes.

Ropes include closely associated bundles of twisted filaments. Each filament diameter in a ropes is relatively uniform. Ropes have varying weights described by their 'tex,' expressed as weight in grams of 1000 linear meters, or denier, expressed as weight in pounds of 10,000 yards, with a typical tex range usually being between about 4000 tex to about 100000 tex.

Tows include loosely associated bundles of untwisted filaments. As in ropes, filament diameter in a tow is generally uniform. Tows also have varying weights and the tex range is usually between 2000 g and 12000 g. They are frequently characterized by the number of thousands of filaments in the tow, for example 10 wire rope, 50 wire rope, 100 wire rope, and the like.

Metal meshes are materials that can be assembled as weaves or can represent non-woven flattened ropes. Metal tapes can vary in width and are generally two-sided structures similar to ribbon. Processes of the present invention are compatible with CNT infusion on one or both sides of a tape. CNT-infused tapes can resemble a "carpet" or "forest" on a flat substrate surface. Again, processes of the invention can be performed in a continuous mode to functionalize spools of tape.

Metal fiber-braids represent rope-like structures of densely packed metal fibers. Such structures can be assembled from ropes, for example. Braided structures can include a hollow portion or a braided structure can be assembled about another core material.

In some embodiments a number of primary metal fiber material structures can be organized into fabric or sheet-like structures. These include, for example, woven metal meshes non-woven metal fiber mat and metal fiber ply, in addition to the tapes described above. Such higher ordered structures can be assembled from parent tows, ropes, filaments or the like, with CNTs already infused in the parent fiber. Alternatively such structures can serve as the substrate for the CNT infusion processes described herein.

Metals fiber materials can include any metal in zero-valent oxidation state including, for example, d-block metals, lanthanides, actinides, main group metals and the like. Any of these metals can also be used in non-zero-valent oxidation state, including, for example, metal oxides, metal nitrides, and the like. Exemplary d-block metals include, for example, scandium, titanium, vanadium, chromium, manganese, iron, cobalt, nickel, copper, zinc, yttrium, zirconium, niobium, molybdenum, technetium, ruthenium, rhodium, palladium, silver, cadmium, hafnium, tantalum, tungsten, rhenium, osmium, iridium, platinum, and gold. Exemplary main group metals include, for example, aluminum, gallium, indium, tin, thallium, lead, and bismuth. Exemplary metal salts useful in the invention include, for example CNTs useful for infusion to metal fiber materials include single-walled CNTs, double-walled CNTs, multi-walled CNTs, and mixtures thereof. The exact CNTs to be used depends on the application of the CNT-infused metal fiber. CNTs can be used for thermal and/or electrical conductivity applications, or as insulators. In some embodiments, the infused carbon nanotubes are single-wall nanotubes. In some embodiments, the infused carbon nanotubes are multi-wall nanotubes. In some embodiments, the infused carbon nanotubes are a combination of single-wall and multi-wall nanotubes. There are some differences in the characteristic properties of single-wall and multi-wall nanotubes that, for some end uses of the fiber, dictate the synthesis of one or the other type of nanotube. For example, single-walled nanotubes can be semi-conducting or metallic, while multi-walled nanotubes are metallic.

CNTs lend their characteristic properties such as mechanical strength, low to moderate electrical resistivity, high thermal conductivity, and the like to the CNT-infused metal fiber material. For example, in some embodiments, the electrical resistivity of a carbon nanotube-infused metal fiber material is lower than the electrical resistivity of a parent metal fiber material. The infused CNTs can also provide beneficial conductivity with lighter weights. Moreover, the use of shorter CNTs can be used to provide a greater tensile strength, while also improving electrical conductivity. More generally, the extent to which the resulting CNT-infused fiber expresses these characteristics can be a function of the extent and density of coverage of the metal fiber by the carbon nanotubes. Any amount of the fiber surface area, from 0-55% of the fiber can be covered assuming an 8 nm diameter, 5-walled MWNT (again this calculation counts the space inside the CNTs as fillable). This number is lower for smaller diameter CNTs and more for greater diameter CNTs. 55% surface area coverage is equivalent to about 15,000 CNTs/micron$^2$. Further CNT properties can be imparted to the metal fiber material in a manner dependent on CNT length, as described above. Infused CNTs can vary in length ranging from between about 1 micron to about 500 microns, including 1 micron, 2 microns, 3 microns, 4 micron, 5, microns, 6, microns, 7 microns, 8 microns, 9 microns, 10 microns, 15 microns, 20 microns, 25 microns, 30 microns, 35 microns, 40 microns, 45 microns, 50 microns, 60 microns, 70 microns, 80 microns, 90 microns, 100 microns, 150 microns, 200 microns, 250 microns, 300 microns, 350 microns, 400 microns, 450 microns, 500 microns, and all values in between. CNTs can also be less than about 1 micron in length, including about 0.5 microns, for example. CNTs can also be greater than 500 microns, including for example, 510 microns, 520 microns, 550 microns, 600 microns, 700 microns and all values in between.

Compositions of the invention can incorporate CNTs having a length from about 1 micron to about 10 microns. Such CNT lengths can be useful in application to increase shear strength. CNTs can also have a length from about 5-70 microns. Such CNT lengths can be useful in application to increase tensile strength if the CNTs are aligned in the fiber direction. CNTs can also have a length from about 10 microns to about 100 microns. Such CNT lengths can be useful to increase electrical/thermal and mechanical properties. The process used in the invention can also provide CNTs having a length from about 100 microns to about 500 microns, which can also be beneficial to increase electrical and thermal properties. One skilled in the art will recognize that the properties imparted are a continuum and that some tensile strength benefits can still be realized at longer CNT lengths. Likewise, shorter CNT lengths can still impart beneficial electrical properties as well. Control of CNT length is readily achieved through modulation of carbon feedstock and carrier gas flow rates coupled with varying process linespeeds and reaction temperatures, as described further below.

In some embodiments, compositions that include spoolable lengths of CNT-infused metal fiber materials can have various uniform regions with different lengths of CNTs. For example, it can be desirable to have a first section of CNT-infused metal fiber material with uniformly shorter CNT lengths to enhance tensile and shear strength properties, and a second section of the same spoolable material with a uniform longer CNT length to enhance electrical or thermal properties.

Processes of the invention for CNT infusion to metal fiber materials allow control of the CNT lengths with uniformity and in a continuous process allowing spoolable metal fiber materials to be functionalized with CNTs at high rates. With material residence times between 5 to 300 seconds, linespeeds in a continuous process for a system that is 3 feet long can be in a range anywhere from about 0.5 ft/min to about 36 ft/min and greater. The speed selected depends on various parameters as explained further below.

In some embodiments, a material residence time of about 5 to about 300 seconds in a CNT growth chamber can produce CNTs having a length between about 1 micron to about 10 microns. In some embodiments, a material residence time of about 30 to about 180 seconds in a CNT growth chamber can produce CNTs having a length between about 10 microns to about 100 microns. In still other embodiments, a material residence time of about 180 to about 300 seconds can produce CNTs having a length between about 100 microns to about 500 microns. One skilled in the art will recognize that these numbers are approximations and that growth temperature and carrier and carbon feedstock flow rates can also impact CNT growth for a given material residence time. For example, increased temperatures typically increase the overall growth rate requiring less material residence time for a desired CNT length. Increased carbon feedstock flow rate ratio (inert to carbon feedstock) can also increase growth rates although this effect is less than changing the growth temperature.

CNT-infused metal fiber materials of the invention include a barrier coating. Barrier coatings can include for example an alkoxysilane, such as methylsiloxane, an alumoxane, alumina nanoparticles, spin on glass and glass nanoparticles. As described below, the CNT-forming catalyst can be added to the uncured barrier coating material and then applied to the metal fiber material together. In other embodiments the barrier coating material can be added to the metal fiber material prior to deposition of the CNT-forming catalyst. The barrier coating material can be of a thickness sufficiently thin to allow exposure of the CNT-forming catalyst to the carbon feedstock for subsequent CVD growth. In some embodiments, the thickness is less than or about equal to the effective diameter of the CNT-forming catalyst. In some embodiments, the thickness is between about 10 nm and about 100 nm. In some embodiments, the thickness can be less than 10 nm, including 1 nm, 2 nm, 3 nm, 4 nm, 5 nm, 6 nm, 7 nm, 8 nm, 9 nm, and any value in between.

Without being bound by theory, the barrier coating can serve as an intermediate layer between the metal fiber material and the CNTs and serves to mechanically infuse the CNTs to the metal fiber material via a locked CNT-forming catalyst nanoparticle that serves as a site CNT growth. Such mechanical infusion provides a robust system in which the metal fiber material serves as a platform for organizing the CNTs while still imparting properties of the CNTs to the metal fiber material. Moreover, the benefit of including a barrier coating is the immediate protection it provides the metal fiber material from chemical damage due to exposure to moisture, oxygen and any thermal effects of alloying, sintering, or the like when heating the metal fiber material at the temperatures used to promote CNT growth.

The infused CNTs can improve the fiber-to-matrix interface in composite materials and, more generally, improve fiber-to-fiber interfaces. Indeed, the CNT-infused metal fiber materials disclosed herein are themselves composite materials in the sense the CNT-infused metal fiber material properties will be a combination of those of the metal fiber material as well as those of the infused CNTs. Consequently, embodiments of the present invention provide a means to impart desired properties to a metal fiber material that otherwise lack such properties or possesses them in insufficient measure. Metal fiber materials can be tailored or engineered to meet the requirements of specific applications. The CNTs behave as a sizing to protect metal fiber materials from absorbing moisture due to the hydrophobic CNT structure, although sizing agents are not commonly employed with metal fibers. Moreover, hydrophobic matrix materials, as further exemplified below, interact well with hydrophobic CNTs to provide improved fiber to matrix interactions.

Compositions of the present invention can further include a matrix material to form a composite with the CNT-infused metal fiber material. Such matrix materials can include, for example, an epoxy, a polyester, a vinylester, a polyetherimide, a polyetherketoneketone, a polyphthalamide, a polyetherketone, a polyetheretherketone, a polyimide, a phenol-formaldehyde, and a bismaleimide. Matrix materials useful in the present invention can include any of the known matrix materials (see Mel M. Schwartz, Composite Materials Handbook (2d ed. 1992)). Matrix materials more generally can include resins (polymers), both thermosetting and thermoplastic, metals, ceramics, and cements.

Thermosetting resins useful as matrix materials include phthalic/maelic type polyesters, vinyl esters, epoxies, phenolics, cyanates, bismaleimides, and nadic end-capped polyimides (e.g., PMR-15). Thermoplastic resins include polysulfones, polyamides, polycarbonates, polyphenylene oxides, polysulfides, polyether ether ketones, polyether sulfones, polyamide-imides, polyetherimides, polyimides, polyarylates, and liquid crystalline polyester.

Metals useful as matrix materials include alloys of aluminum such as aluminum 6061, 2024, and 713 aluminum braze. Ceramics useful as matrix materials include carbon ceramics, such as lithium aluminosilicate, oxides such as alumina and mullite, nitrides such as silicon nitride, and carbides such as silicon carbide. Cements useful as matrix materials include carbide-base cements (tungsten carbide, chromium carbide, and titanium carbide), refractory cements (tungsten-thoria and barium-carbonate-nickel), chromium-alumina, nickel-magnesia iron-zirconium carbide. Any of the above-described matrix materials can be used alone or in combination.

Applications that use CNT-infused metal fibers are numerous. Exemplary applications include, without limitation, photovoltaic devices, semiconducting materials, decreasing resistivity, powerlines, dampening characteristics, audio speaker systems, EMI shielding, solar collectors, electrodes for batteries, supercapacitors, data cable fiber, rf cabling, and coaxial cables. CNT-infused metal fiber materials can enhance structural elements in numerous industries including, for example, automotive, sports and leisure equipment, aerospace and ballistics applications, and the like.

In some embodiments the present invention provides a continuous process for CNT infusion that includes (a) disposing a carbon nanotube-forming catalyst on a surface of a glass fiber material of spoolable dimensions; and (b) synthesizing carbon nanotubes directly on the glass fiber material, thereby forming a carbon nanotube-infused glass fiber material. For a 9 foot long system, the linespeed of the process can range from between about 1.5 ft/min to about 108 ft/min. The linespeeds achieved by the process described herein allow the formation of commercially relevant quantities of CNT-infused glass fiber materials with short production times. For example, at 36 ft/min linespeed, the quantities of CNT-infused glass fibers (over 5% infused CNTs on fiber by weight) can exceed over 250 pound or more of material produced per day in a system that is designed to simultaneously process 5 separate rovings (50 lb/roving). Systems can be made to produce more rovings at once or at faster speeds by repeating growth zones. Moreover, some steps in the fabrication of CNTs, as known in the art, have prohibitively slow rates preventing a continuous mode of operation. For example, in a typical process known in the art, a CNT-forming catalyst reduction step can take 1-12 hours to perform. The process described herein overcomes such rate limiting steps.

The linespeeds achievable using processes of the invention are particular remarkable when considering that some steps in the fabrication of CNTs, as known in the art, have otherwise prohibitively slow rates, thus preventing a continuous mode of operation. For example, in a typical process known in the art, a CNT-forming catalyst reduction step can take 1-12 hours to perform. CNT growth itself can also be time consuming, for example requiring tens of minutes for CNT growth, precluding the rapid linespeeds realized in the present invention. The process described herein overcomes such rate limiting steps.

The CNT-infused metal fiber material-forming processes of the invention can avoid CNT entanglement that occurs when trying to apply suspensions of pre-formed carbon nanotubes to fiber materials. That is, because pre-formed CNTs are not fused to the metal fiber material, the CNTs tend to bundle and entangle. The result is a poorly uniform distribution of CNTs that weakly adhere to the metal fiber material. However, processes of the present invention can provide, if desired, a highly uniform entangled CNT mat on the surface of the metal fiber material by reducing the growth density. The CNTs grown at low density are infused in the metal fiber material first. In such embodiments, the fibers do not grow dense enough to induce vertical alignment, the result is entangled mats on the metal fiber material surfaces. By contrast, manual application of pre-formed CNTs does not insure uniform distribution and density of a CNT mat on the metal fiber material.

Figure 5:
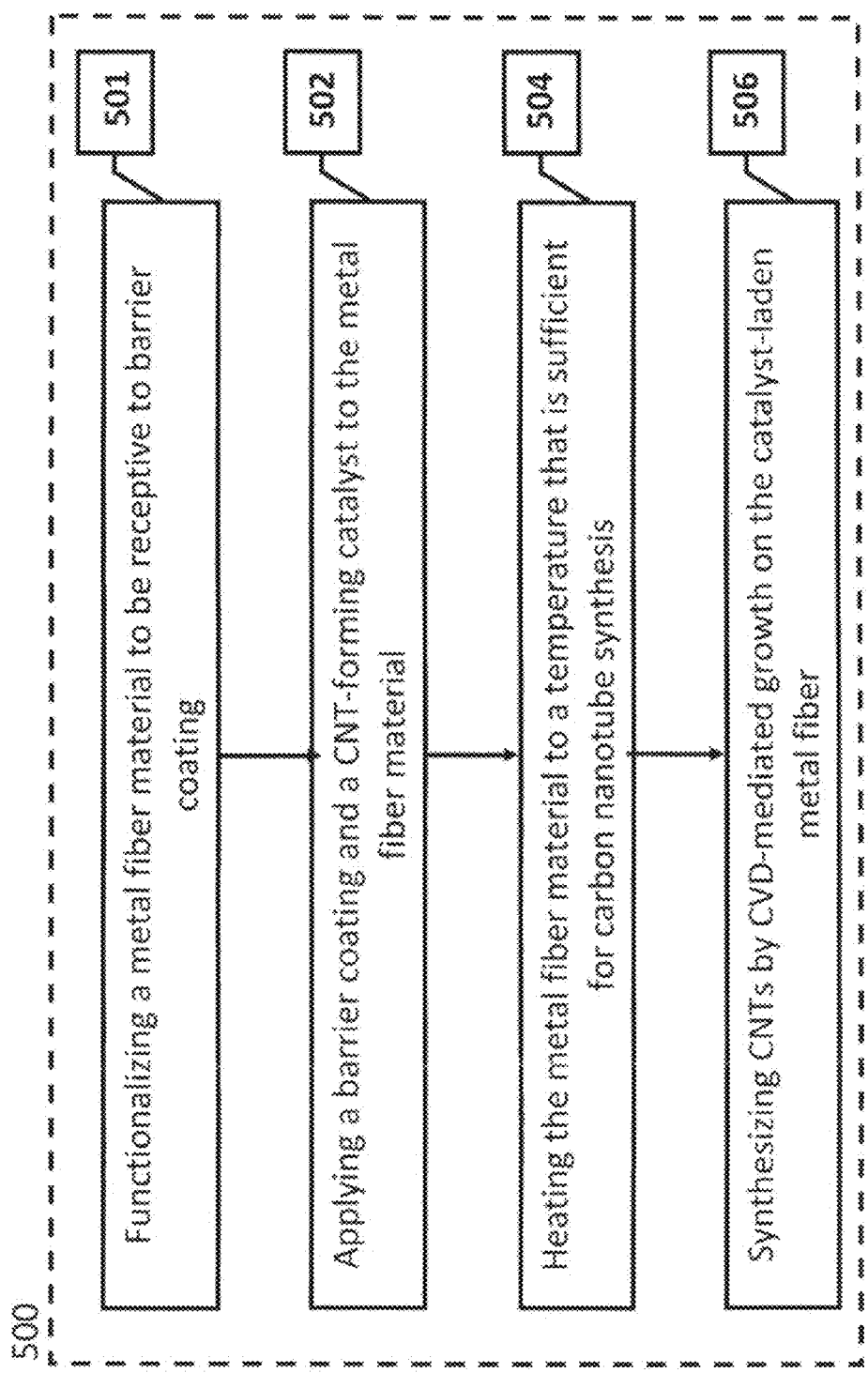
FIG. 5 shows a process for producing CNT-infused metal fiber material in accordance with some embodiments of the present invention.

FIG. 5 depicts a flow diagram of process 200 for producing CNT-infused metal fiber material in accordance with an illustrative embodiment of the present invention.

Process 200 includes at least the operations of:
201: Functionalizing a metal fiber material to be receptive to barrier coating.
202: Applying a barrier coating and a CNT-forming catalyst to the metal fiber material.
204: Heating the metal fiber material to a temperature that is sufficient for carbon nanotube synthesis.
206: Synthesizing CNTs by CVD-mediated growth on the catalyst-laden metal fiber.

To prepare a metal fiber material for barrier coating, operation 201 of functionalizing the metal fiber material is performed. In some embodiments, functionalizing the metal fiber material can include a wet chemical oxidative etch to create reactive functional groups (metal oxo and/or hydroxyl groups) on the metal fiber material surface. This can be particularly useful when using zero-valent metals to create a surface oxide layer. In other embodiments, functionalizing can include a plasma process, which may serve a dual role of creating functional groups as described above, and roughening the metal fiber material surface to enhance the surface area and wetting properties of the metal fiber material, including the deposition of the barrier coating. To infuse carbon nanotubes into a metal fiber material, the carbon nanotubes are synthesized on a metal fiber material which is conformally coated with a barrier coating. In one embodiment, this is accomplished by conformally coating the metal fiber material with a barrier coating and then disposing carbon nanotube-forming catalyst on the barrier coating, as per operation 202. In some embodiments, the barrier coating can be partially cured prior to catalyst deposition. This can provide a surface that is receptive to receiving the catalyst and allowing it to embed in the barrier coating, including allowing surface contact between the CNT forming catalyst and the metal fiber material. In such embodiments, the barrier coating can be fully cured after embedding the catalyst. In some embodiments, the barrier coating is conformally coated over the metal fiber material simultaneously with deposition of the CNT-form catalyst. Once the CNT-forming catalyst and barrier coating are in place, the barrier coating can be fully cured.

In some embodiments, the barrier coating can be fully cured prior to catalyst deposition. In such embodiments, a fully cured barrier-coated metal fiber material can be treated with a plasma to prepare the surface to accept the catalyst. For example, a plasma treated metal fiber material having a cured barrier coating can provide a roughened surface in which the CNT-forming catalyst can be deposited. The plasma process for "roughing" the surface of the barrier coating thus facilitates catalyst deposition. The roughness is typically on the scale of nanometers. In the plasma treatment process craters or depressions are formed that are nanometers deep and nanometers in diameter. Such surface modification can be achieved using a plasma of any one or more of a variety of different gases, including, without limitation, argon, helium, oxygen, nitrogen, and hydrogen. In order to treat metal fiber material in a continuous manner, 'atmospheric' plasma which does not require vacuum must be utilized. Plasma is created by applying voltage across two electrodes, which in turn ionizes the gaseous species between the two electrodes. A plasma environment can be applied to a metal fiber substrate in a 'downstream' manner in which the ionized gases are flowed down toward the substrate. It is also possible to send the metal fiber substrate between the two electrodes and into the plasma environment to be treated.

In some embodiments, the metal fiber can be treated with a plasma environment prior to barrier coating application. For example, a plasma treated metal fiber material can have a higher surface energy and therefore allow for better wet-out and coverage of the barrier coating. The plasma process can also add roughness to the metal fiber surface allowing for better mechanical bonding of the barrier coating in the same manner as mentioned above.

The catalyst can be prepared as a liquid solution that contains CNT-forming catalyst that includes transition metal nanoparticles. The diameters of the synthesized nanotubes are related to the size of the metal particles as described above. In some embodiments, commercial dispersions of CNT-forming transition metal nanoparticle catalyst are available and are used without dilution, in other embodiments commercial dispersions of catalyst can be diluted. Whether or not to dilute such solutions can depend on the desired density and length of CNT to be grown as described above.

With reference to the illustrative embodiment of FIG. 5, carbon nanotube synthesis is shown based on a chemical vapor deposition (CVD) process and occurs at elevated temperatures. The specific temperature is a function of catalyst choice, but will typically be in a range of about 500 to 1000° C. Accordingly, operation 204 involves heating the barrier-coated metal fiber material to a temperature in the aforementioned range to support carbon nanotube synthesis. When using metal fiber materials having lower melting points, or that are temperature sensitive, a pre-heat of the feedstock and carrier gas can be employed as describer further below.

In operation 206, CVD-promoted nanotube growth on the catalyst-laden metal fiber material is then performed. The CVD process can be promoted by, for example, a carbon-containing feedstock gas such as acetylene, ethylene, and/or ethanol. The CNT synthesis processes generally use an inert gas (nitrogen, argon, helium) as a primary carrier gas. The carbon feedstock is provided in a range from between about 0% to about 15% of the total mixture. A substantially inert environment for CVD growth is prepared by removal of moisture and oxygen from the growth chamber.

In the CNT synthesis process, CNTs grow at the sites of a CNT-forming transition metal nanoparticle catalyst. The presence of a strong plasma-creating electric field can be optionally employed to affect nanotube growth. That is, the growth tends to follow the direction of the electric field. By properly adjusting the geometry of the plasma spray and electric field, vertically-aligned CNTs (i.e., perpendicular to the metal fiber material) can be synthesized. Under certain conditions, even in the absence of a plasma, closely-spaced nanotubes will maintain a vertical growth direction resulting in a dense array of CNTs resembling a carpet or forest. The presence of the barrier coating can also influence the directionality of CNT growth.

The operation of disposing a catalyst on the metal fiber material can be accomplished by spraying or dip coating a solution or by gas phase deposition via, for example, a plasma process. The choice of techniques can be coordinated with the mode with which the barrier coating is applied. Thus, in some embodiments, after forming a solution of a catalyst in a solvent, catalyst can be applied by spraying or dip coating the barrier coated metal fiber material with the solution, or combinations of spraying and dip coating. Either technique, used alone or in combination, can be employed once, twice, thrice, four times, up to any number of times to provide a metal fiber material that is sufficiently uniformly coated with CNT-forming catalyst. When dip coating is employed, for example, a metal fiber material can be placed in a first dip bath for a first residence time in the first dip bath. When employing a second dip bath, the metal fiber material can be placed in the second dip bath for a second residence time. For example, metal fiber materials can be subjected to a solution of CNT-forming catalyst for between about 3 seconds to about 90 seconds depending on the dip configuration and linespeed. Employing spraying or dip coating processes, a metal fiber material with a surface density of catalyst of less than about 5% surface coverage to as high as about 80% coverage, in which the CNT-forming catalyst nanoparticles are nearly a monolayer. In some embodiments, the process of coating the CNT-forming catalyst on the metal fiber material should produce no more than a monolayer. For example, CNT growth on a stack of CNT-forming catalyst can erode the degree of infusion of the CNT to the metal fiber material. In other embodiments, the transition metal catalyst can be deposited on the metal fiber material using evaporation techniques, electrolytic deposition techniques, and other processes known to those skilled in the art, such as addition of the transition metal catalyst to a plasma feedstock gas as a metal organic, metal salt or other composition promoting gas phase transport.

Because processes of the invention are designed to be continuous, a spoolable metal fiber material can be dip-coated in a series of baths where dip coating baths are spatially separated. In a continuous process in which nascent metal fibers are being generated de novo, dip bath or spraying of CNT-forming catalyst can be the first step after applying and curing or partially curing a barrier coating to the metal fiber material. In other embodiments, the CNT-forming catalyst can be applied to newly formed metal fibers in the presence of other sizing agents after barrier coating. Such simultaneous application of CNT-forming catalyst and other sizing agents can still provide the CNT-forming catalyst in surface contact with the barrier coating of the metal fiber material to insure CNT infusion.

The catalyst solution employed can be a transition metal nanoparticle which can be any d-block transition metal as described above. In addition, the nanoparticles can include alloys and non-alloy mixtures of d-block metals in elemental form or in salt form, and mixtures thereof. Such salt forms include, without limitation, oxides, carbides, and nitrides. Non-limiting exemplary transition metal NPs include Ni, Fe, Co, Mo, Cu, Pt, Au, and Ag and salts thereof and mixtures thereof. In some embodiments, such CNT-forming catalysts are disposed on the metal fiber by applying or infusing a CNT-forming catalyst directly to the metal fiber material simultaneously with barrier coating deposition. Many of these transition metal catalysts are readily commercially available from a variety of suppliers, including, for example, Ferrotec Corporation (Bedford, N.H.).

Catalyst solutions used for applying the CNT-forming catalyst to the metal fiber material can be in any common solvent that allows the CNT-forming catalyst to be uniformly dispersed throughout. Such solvents can include, without limitation, water, acetone, hexane, isopropyl alcohol, toluene, ethanol, methanol, tetrahydrofuran (THF), cyclohexane or any other solvent with controlled polarity to create an appropriate dispersion of the CNT-forming catalyst nanoparticles. Concentrations of CNT-forming catalyst can be in a range from about 1:1 to 1:10000 catalyst to solvent. Such concentrations can be used when the barrier coating and CNT-forming catalyst is applied simultaneously as well. In some embodiments heating of the barrier coated metal fiber material can be at a temperature that is between about 500° C. and 1000° C. depending on the specific metal substrate to synthesize carbon nanotubes after deposition of the CNT-forming catalyst. Heating at these temperatures can be performed prior to or substantially simultaneously with introduction of a carbon feedstock for CNT growth, although specific and separate heating conditions for the carbon feedstock and metal fiber material can be controlled, as explained further below. Furthermore, the actual temperature to be employed will also be a function of the metal fiber material's temperature tolerance, which can be mitigated by the presence of the barrier coating.

In some embodiments, the present invention provides a process that includes removing sizing agents from a metal fiber material, applying a barrier coating conformally over the metal fiber material, applying a CNT-forming catalyst to the metal fiber material, heating the metal fiber material to at least 500° C., and synthesizing carbon nanotubes on the metal fiber material. In some embodiments, operations of the CNT-infusion process include removing sizing from a metal fiber material, applying a barrier coating to the metal fiber material, applying a CNT-forming catalyst to the metal fiber, heating the fiber to CNT-synthesis temperature and CVD-promoted CNT growth the catalyst-laden metal fiber material. Thus, where commercial metal fiber materials are employed, processes for constructing CNT-infused metal fibers can include a discrete step of removing sizing from the metal fiber material before disposing barrier coating and the catalyst on the metal fiber material.

The step of synthesizing carbon nanotubes can include numerous techniques for forming carbon nanotubes, including those disclosed in co-pending U.S. Patent Application No. US 2004/0245088 which is incorporated herein by reference. The CNTs grown on fibers of the present invention can be accomplished by techniques known in the art including, without limitation, micro-cavity, thermal or plasma-enhanced CVD techniques, laser ablation, arc discharge, and high pressure carbon monoxide (HiPCO). During CVD, in particular, a barrier coated metal fiber material with CNT-forming catalyst disposed thereon, can be used directly. In some embodiments, any conventional sizing agents can be optionally removed prior to CNT synthesis. In some embodiments, acetylene gas is ionized to create a jet of cold carbon plasma for CNT synthesis. The plasma is directed toward the catalyst-bearing metal fiber material. Thus, in some embodiments synthesizing CNTs on a metal fiber material includes (a) forming a carbon plasma; and (b) directing the carbon plasma onto said catalyst disposed on the metal fiber material. The diameters of the CNTs that are grown are dictated, in part, by the size of the CNT-forming catalyst as described above. To initiate the growth of CNTs, two gases are bled into the reactor: a carrier or process gas such as argon, helium, or nitrogen, and a carbon-containing feedstock gas, such as acetylene, ethylene, ethanol or methane. CNTs grow at the sites of the CNT-forming catalyst.

In some embodiments, the CVD growth is plasma-enhanced. A plasma can be generated by providing an electric field during the growth process. CNTs grown under these conditions can follow the direction of the electric field. Thus, by adjusting the geometry of the reactor vertically aligned carbon nanotubes can be grown radially about a cylindrical fiber. In some embodiments, a plasma is not required for radial growth about the fiber. For metal fiber materials that have distinct sides such as tapes, mats, fabrics, plies, ribbons, meshes, and solid and perforated sheets, catalyst can be disposed on one or both sides and correspondingly, CNTs can be grown on one or both sides as well.

As described above, CNT-synthesis is performed at a rate sufficient to provide a continuous process for functionalizing spoolable metal fiber materials. Numerous apparatus configurations facilitate such continuous synthesis as exemplified below.

In some embodiments, CNT-infused metal fiber materials can be constructed in an "all plasma" process. In such embodiments, barrier coated metal fiber materials pass through numerous plasma-mediated steps to form the final CNT-infused product. The first of the plasma processes, can include a step of fiber surface modification. This is a plasma process for "roughing" the surface of the barrier coating on the metal fiber material to facilitate catalyst deposition, as described above. As described above, surface modification can be achieved using a plasma of any one or more of a variety of different gases, including, without limitation, argon, helium, oxygen, ammonia, hydrogen, and nitrogen.

After surface modification, the barrier coated metal fiber material proceeds to catalyst application. This is a plasma process for depositing the CNT-forming catalyst on the fibers. The CNT-forming catalyst is typically a transition metal as described above. The transition metal catalyst can be added to a plasma feedstock gas as a precursor in the form of a ferrofluid, a metal organic, metal salt or other composition for promoting gas phase transport. The catalyst can be applied at room temperature in the ambient environment with neither vacuum nor an inert atmosphere being required. In some embodiments, the metal fiber material is cooled prior to catalyst application.

Continuing the all-plasma process, carbon nanotube synthesis occurs in a CNT-growth reactor. This can be achieved through the use of plasma-enhanced chemical vapor deposition, wherein carbon plasma is sprayed onto the catalyst-laden fibers. Since carbon nanotube growth occurs at elevated temperatures (typically in a range of about 500 to 1000° C. depending on the metal substrate and catalyst), the catalyst-laden fibers can be heated prior to exposing to the carbon plasma. After heating, the metal fiber material is ready to receive the carbon plasma. The carbon plasma is generated, for example, by passing a carbon containing gas such as acetylene, ethylene, ethanol, and the like, through an electric field that is capable of ionizing the gas. This cold carbon plasma is directed, via spray nozzles, to the metal fiber material. The metal fiber material can be in close proximity to the spray nozzles, such as within about 1 centimeter of the spray nozzles, to receive the plasma. In some embodiments, heaters are disposed above the metal fiber material at the plasma sprayers to maintain the elevated temperature of the metal fiber material.

A further design configuration for continuous carbon nanotube synthesis involves a special rectangular reactor for the synthesis and growth of carbon nanotubes directly on metal fiber materials. The reactor can be designed for use in a continuous in-line process for producing carbon-nanotube bearing metal fiber materials. In some embodiments, CNTs are grown via a chemical vapor deposition ("CVD") process at atmospheric pressure and at elevated temperature in the range of about 550° C. to about 800° C. in a multi-zone reactor depending on the specific metal substrate. The fact that the synthesis occurs at atmospheric pressure is one factor that facilitates the incorporation of the reactor into a continuous processing line for CNT-on-fiber synthesis. Another advantage consistent with in-line continuous processing using such a zone reactor is that CNT growth occurs in seconds, as opposed to minutes (or longer) as in other procedures and apparatus configurations typical in the art.

CNT synthesis reactors in accordance with the various embodiments include the following features:

Rectangular Configured Synthesis Reactors:

The cross section of a typical CNT synthesis reactor known in the art is circular. There are a number of reasons for this including, for example, historical reasons (cylindrical reactors are often used in laboratories) and convenience (flow dynamics are easy to model in cylindrical reactors, heater systems readily accept circular tubes (quartz, etc.), and ease of manufacturing. Departing from the cylindrical convention, the present invention provides a CNT synthesis reactor having a rectangular cross section. The reasons for the departure are as follows:

1. Since many metal fiber materials that can be processed by the reactor are relatively planar such as flat tape or sheet-like in form, a circular cross section is an inefficient use of the reactor volume. This inefficiency results in several drawbacks for cylindrical CNT synthesis reactors including, for example, a) maintaining a sufficient system purge; increased reactor volume requires increased gas flow rates to maintain the same level of gas purge. This results in a system that is inefficient for high volume production of CNTs in an open environment; b) increased carbon feedstock gas flow; the relative increase in inert gas flow, as per a) above, requires increased carbon feedstock gas flows. Consider that the volume of a 12K metal fiber tow is 2000 times less than the total volume of a synthesis reactor having a rectangular cross section. In an equivalent growth cylindrical reactor (i.e., a cylindrical reactor that has a width that accommodates the same planarized metal fiber material as the rectangular cross-section reactor), the volume of the metal fiber material is 17,500 times less than the volume of the chamber. Although gas deposition processes, such as CVD, are typically governed by pressure and temperature alone, volume has a significant impact on the efficiency of deposition. With a rectangular reactor there is a still excess volume. This excess volume facilitates unwanted reactions; yet a cylindrical reactor has about eight times that volume. Due to this greater opportunity for competing reactions to occur, the desired reactions effectively occur more slowly in a cylindrical reactor chamber. Such a slow down in CNT growth, is problematic for the development of a continuous process. One benefit of a rectangular reactor configuration is that the reactor volume can be decreased by using a small height for the rectangular chamber to make this volume ratio better and reactions more efficient. In some embodiments of the present invention, the total volume of a rectangular synthesis reactor is no more than about 3000 times greater than the total volume of a metal fiber material being passed through the synthesis reactor. In some further embodiments, the total volume of the rectangular synthesis reactor is no more than about 4000 times greater than the total volume of the metal fiber material being passed through the synthesis reactor. In some still further embodiments, the total volume of the rectangular synthesis reactor is less than about 10,000 times greater than the total volume of the metal fiber material being passed through the synthesis reactor. Additionally, it is notable that when using a cylindrical reactor, more carbon feedstock gas is required to provide the same flow percent as compared to reactors having a rectangular cross section. It should be appreciated that in some other embodiments, the synthesis reactor has a cross section that is described by polygonal forms that are not rectangular, but are relatively similar thereto and provide a similar reduction in reactor volume relative to a reactor having a circular cross section; c) problematic temperature distribution; when a relatively small-diameter reactor is used, the temperature gradient from the center of the chamber to the walls thereof is minimal. But with increased size, such as would be used for commercial-scale production, the temperature gradient increases. Such temperature gradients result in product quality variations across a metal fiber material (i.e., product quality varies as a function of radial position). This problem is substantially avoided when using a reactor having a rectangular cross section. In particular, when a planar substrate is used, reactor height can be maintained constant as the size of the substrate scales upward. Temperature gradients between the top and bottom of the reactor are essentially negligible as well and, as a consequence, thermal issues and the product-quality variations that can result are avoided.

2. Gas introduction: Because tubular furnaces are normally employed in the art, typical CNT synthesis reactors introduce gas at one end and draw it through the reactor to the other end. In some embodiments disclosed herein, gas can be introduced at the center of the reactor or within a target growth zone, symmetrically, either through the sides or through the top and bottom plates of the reactor. This improves the overall CNT growth rate because the incoming feedstock gas is continuously replenishing at the hottest portion of the system, which is where CNT growth is most active. This constant gas replenishment is an important aspect to the increased growth rate exhibited by the rectangular CNT reactors.

Zoning.

Chambers that provide a relatively cool purge zone depend from both ends of the rectangular synthesis reactor used in the continuous process. Applicants have determined that if hot gas were to mix with the external environment (i.e., outside of the reactor), there would be an increase in degradation of the metal fiber material. The cool purge zones provide a buffer between the internal system and external environments. Typical CNT synthesis reactor configurations known in the art typically require that the substrate is carefully (and slowly) cooled. The cool purge zone at the exit of the present rectangular CNT growth reactor achieves the cooling in a short period of time, as required for the continuous in-line processing.

Non-Contact, Hot-Walled, Metallic Reactor.

In some embodiments, a hot-walled reactor made of metal is employed, in particular stainless steel. This may appear counterintuitive because metal, and stainless steel in particular, is more susceptible to carbon deposition (i.e., soot and by-product formation). Thus, most CNT reactor configurations use quartz reactors because there is less carbon deposited, quartz is easier to clean, and quartz facilitates sample observation. However, Applicants have observed that the increased soot and carbon deposition on stainless steel results in more consistent, faster, more efficient, and more stable CNT growth. Without being bound by theory it has been indicated that, in conjunction with atmospheric operation, the CVD process occurring in the reactor is diffusion limited. That is, the catalyst is "overfed;" too much carbon is available in the reactor system due to its relatively higher partial pressure (than if the reactor was operating under partial vacuum). As a consequence, in an open system—especially a clean one—too much carbon can adhere to catalyst particles, compromising their ability to synthesize CNTs. In some embodiments, the rectangular reactor is intentionally run when the reactor is "dirty," that is with soot deposited on the metallic reactor walls. Once carbon deposits to a monolayer on the walls of the reactor, carbon will readily deposit over itself. Since some of the available carbon is "withdrawn" due to this mechanism, the remaining carbon feedstock, in the form of radicals, react with the catalyst at a rate that does not poison the catalyst. Existing systems run "cleanly" which, if they were open for continuous processing, would produce a much lower yield of CNTs at reduced growth rates.

Although it is generally beneficial to perform CNT synthesis "dirty" as described above, certain portions of the apparatus, such as gas manifolds and inlets, can nonetheless negatively impact the CNT growth process when soot creates blockages. In order to combat this problem, such areas of the CNT growth reaction chamber can be protected with soot inhibiting coatings such as silica, alumina, or MgO. In practice, these portions of the apparatus can be dip-coated in these soot inhibiting coatings. Metals such as INVAR® can be used with these coatings as INVAR has a similar CTE (coefficient of thermal expansion) ensuring proper adhesion of the coating at higher temperatures, preventing the soot from significantly building up in critical zones.

Combined Catalyst Reduction and CNT Synthesis.

In the CNT synthesis reactor disclosed herein, both catalyst reduction and CNT growth occur within the reactor. This is significant because the reduction step cannot be accomplished timely enough for use in a continuous process if performed as a discrete operation. In a typical process known in the art, a reduction step typically takes 1-12 hours to perform. Both operations occur in a reactor in accordance with the present invention due, at least in part, to the fact that carbon feedstock gas is introduced at the center of the reactor, not the end as would be typical in the art using cylindrical reactors. The reduction process occurs as the fibers enter the heated zone; by this point, the gas has had time to react with the walls and cool off prior to reacting with the catalyst and causing the oxidation-reduction (via hydrogen radical interactions). It is this transition region where the reduction occurs. At the hottest isothermal zone in the system, the CNT growth occurs, with the greatest growth rate occurring proximal to the gas inlets near the center of the reactor.

Figure 6:
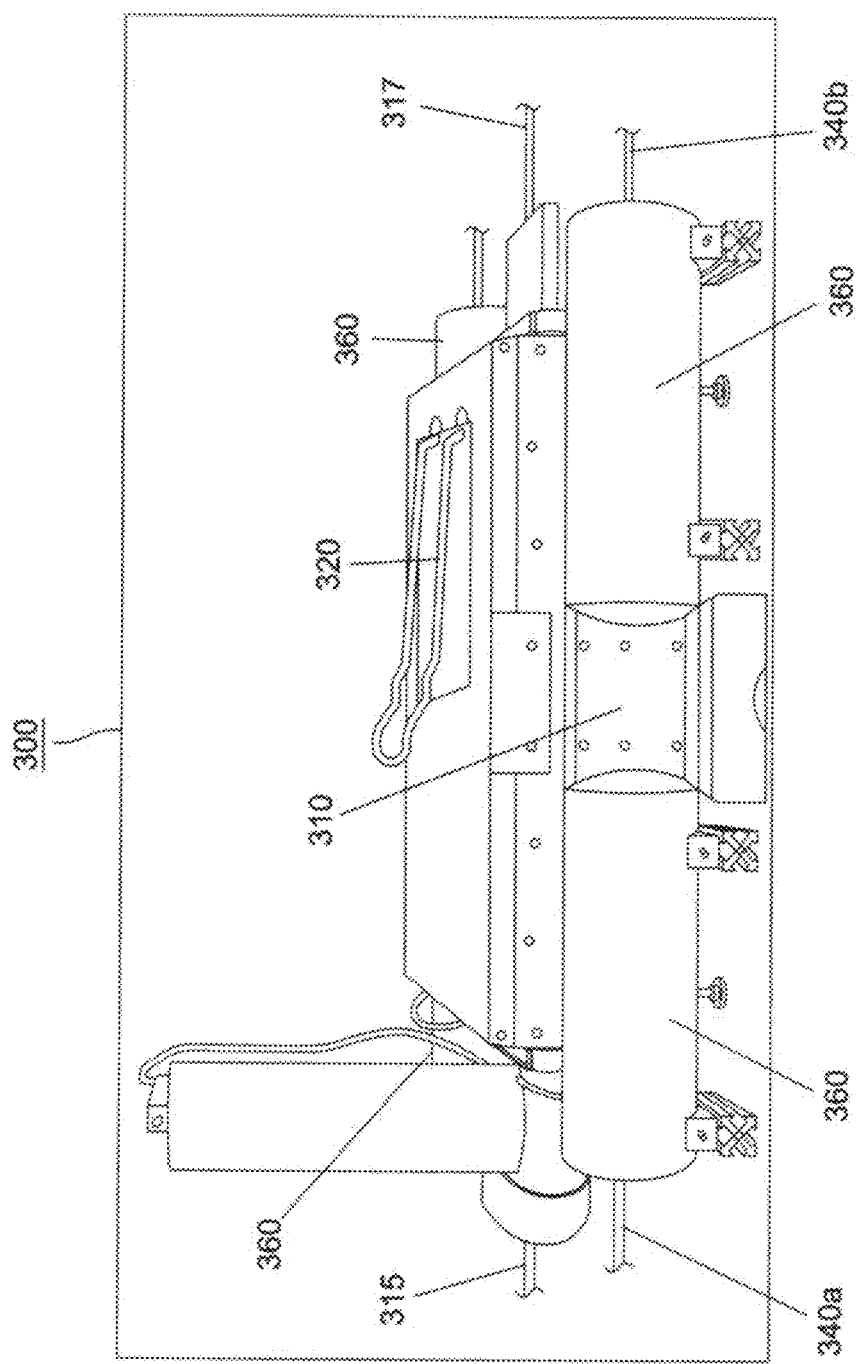
FIG. 6 shows an apparatus used for CNT growth that includes a carbon feed gas pre-heater for low temperature CNT synthesis.

With reference to FIG. 6, there is illustrated a schematic diagram of a system 300 for synthesis of carbon nanotubes using a low temperature process. Such a system can be employed especially in the case of low melting, or especially temperature sensitive, metal fiber materials. System 300 includes a growth chamber 310, a heater 320, a metal fiber material source 330, a carbon feed gas source 340, a process or carrier gas source 350, a gas pre-heater 360, and a controller (not shown).

In some embodiments, growth chamber 310 is an open-air continuous operation, flow through reactor. The system can operate at atmospheric pressure, in some embodiments, and at reduced pressures in other embodiments. Growth chamber 310 includes a small volume cavity (not shown) through which a metal fiber material enters from one end and exits from a second end continuously, thereby facilitating continuous synthesis of carbon nanotubes on the metal fiber material. A metal fiber material, such as a tow, for example, allows for a continuous feed of metal fiber from upstream source 330.

Figure 7:
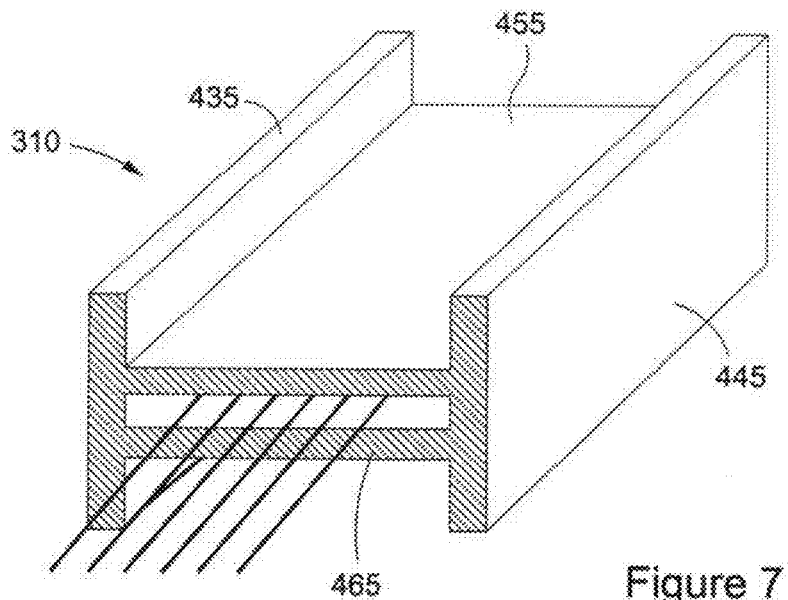
FIG. 7 shows a cross-sectional view of a CNT synthesis growth chamber.

A gas mixture containing a carbon feedstock gas and a process or carrier gas can be continuously fed into the chamber cavity. Growth chamber 310 can be formed by two vertical members 435 and 445 and two horizontal members 455 and 465, arranged in a generally H-shaped configuration, as shown in FIG. 7. Growth chamber 310, has a small cavity volume, as described above to enhance the CNT growth rate. A metal fiber material with appropriate barrier coating and CNT-forming catalyst passes through the growth chamber at one end at a rate determined by a controller at a first temperature $T_1$ maintained by the same controller, or optionally, a separate controller operably-linked to the first controller. Temperature $T_1$ is sufficiently high to allow the growth of carbon nanotubes on the metal fiber material, but not so high as to adversely impact the physical and chemical properties of the metal fiber material. The integrity of the fiber can also be protected by the presence of the barrier coating, which can act as a thermal insulator. For example, first temperature $T_1$ can be about 350-650° C. Pre-heated carbon feedstock and any carrier gas is provided at temperature $T_2$, a temperature higher than $T_1$, to facilitate CNT synthesis on the metal fiber material. After CNT synthesis the metal fiber material exits growth chamber 310 at the opposite end. From there the CNT-infused metal fiber material can be subjected to numerous post CNT growth processing steps such as application of sizing agents.

Heater 320 heats the cavity of growth chamber 310 and maintains the operational temperature $T_1$ of the chamber at a pre-set level. In some embodiments, heater 320, controlled by the controller, takes the form of a heating coil contained in each of horizontal members 455 and 465. Because horizontal members 455 and 465 are closely spaced to provide a small volume cavity, the gap through which the metal fiber material passes is uniformly heated without any significant temperature gradient. Thus, heater 320 heats the surfaces of horizontal members 455 and 465 to provide uniform heating throughout growth chamber 310. In some embodiments, the gap between horizontal members 455 and 465 is between about 1 to 25 mm Metal fiber material source 330 can be adapted to continuously supply the metal fiber material to growth chamber 310. A typical metal fiber material can be supplied as a tow, yarn, fabric, or other form as disclosed herein above. Carbon feed gas source 340 is in fluid communication with gas pre-heater 360. Gas pre-heater 360 is thermally isolated from growth chamber 310 to prevent unintentional heating of growth chamber 310. Furthermore, gas pre-heater 360 is thermally insulated from the environment. Gas per-heater 360 can include resistive heat torches, coiled tubes heated inside a resistively heated ceramic heater, induction heating, hot filaments in the gas stream, and infrared heating. In some embodiments, carbon feed gas source 340 and process gas 350 are mixed before the being supplied to pre-heater 360. Carbon feed gas source 340 is heated by pre-heater 360 to temperature $T_2$, such that the carbon feed is dissociated or thermally "cracked" into the requisite free carbon radicals which, in the presence of the CNT-forming catalyst disposed on the metal fiber material, facilitate CNT growth. In some embodiments, the carbon feed gas source is acetylene and the process gas is nitrogen, helium, argon, or mixtures thereof. Acetylene gas as the carbon feed source obviates the need for a separate process of introducing hydrogen into growth chamber 310 to reduce transition metal nanoparticle catalysts that are in their oxide form. The flow rates of carbon feed gas source 340 and process gas 350 can also be maintained by the controller, or optionally, by another controller operably-linked to first controller.

It is understood that the controller can be adapted to independently sense, monitor, and control the system parameters as detailed above. The controller (multiple controllers) can be an integrated, automated computerized system controller that receives parameter data and performs various automated adjustments of control parameters or a manual control arrangement.

In some embodiments, when a carbon feed gas containing acetylene is heated to a temperature $T_2$, which can be between, for example, 550-1000° C., and fed into growth chamber 310, the acetylene dissociates into carbon and hydrogen in the presence of the catalyst on the metal fiber material. The higher temperature $T_2$ facilitates rapid dissociation of acetylene, but because it is heated externally in pre-heater 360, while maintaining chamber temperature at lower temperature $T_1$, the integrity of the metal fiber material is preserved during CNT synthesis.

Figure 8:
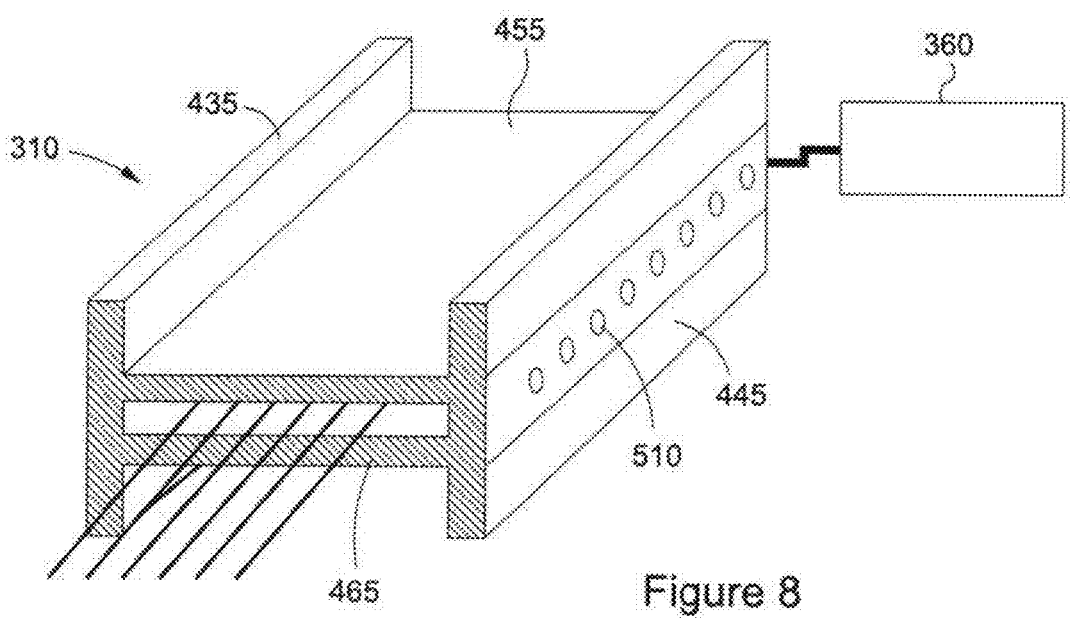
FIG. 8 shows a cross-sectional view of a CNT synthesis growth chamber that includes a carbon feed gas pre-heater and diffuser for low temperature CNT synthesis.

FIG. 8 shows an alternate embodiment in which a diffuser 510 is disposed between pre-heater 360 and growth chamber 310. Diffuser 510 provides a uniform distribution of the carbon feed gas and process gas mixture over the metal fiber material in the growth chamber. In some embodiments, diffuser 510 takes the form of a plate with uniformly distributed apertures for gas delivery. In some embodiments, diffuser 510 extends along a selected section of growth chamber 310. In alternate embodiments, diffuser 510 extends along the entirety of growth chamber 310. Diffuser 510 can be positioned adjacent to growth chamber 310 in a horizontal direction along vertical members 435 and 445 (FIG. 8). In still other embodiments, diffuser 510 is positioned adjacent to growth chamber 310 in a vertical direction along members 455 and 465. In yet another embodiment, diffuser 510 is incorporated into pre-heater 360.

In some embodiments, when loosely affiliated metal fiber materials, such as a tow are employed, the continuous process can include steps that spread out the strands and/or filaments of the tow. Thus, as a tow is unspooled it can be spread using a vacuum-based fiber spreading system, for example. When employing sized metal fiber materials, which can be relatively stiff, additional heating can be employed in order to "soften" the tow to facilitate fiber spreading. The spread fibers which comprise individual filaments can be spread apart sufficiently to expose an entire surface area of the filaments, thus allowing the tow to more efficiently react in subsequent process steps. For example, the spread metal fiber tow can pass through a surface treatment step that is composed of a plasma system and/or barrier coating as described above. The roughened and/or coated, spread fibers then can pass through a CNT-forming catalyst dip bath. The result is fibers of the metal fiber tow that have catalyst particles distributed radially on their surface. The catalyst-laden fibers of the tow then enter an appropriate CNT growth chamber, such as the rectangular chamber equipped with a gas pre-heater as described above, where a flow through atmospheric pressure CVD or PE-CVD process is used to synthesize the CNTs at rates as high as several microns per second, including between about 0.1 to 10 microns per second. The fibers of the tow, now with radially aligned CNTs, exit the CNT growth reactor.

In some embodiments, CNT-infused metal fiber materials can pass through yet another treatment process that, in some embodiments is a plasma process used to functionalize the CNTs. Additional functionalization of CNTs can be used to promote their adhesion to particular resins. Thus, in some embodiments, the present invention provides CNT-infused metal fiber materials having functionalized CNTs.

As part of the continuous processing of spoolable metal fiber materials, the a CNT-infused metal fiber material can further pass through a sizing dip bath to apply any additional sizing agents which can be beneficial in a final product. Finally if wet winding is desired, the CNT-infused metal fiber materials can be passed through a resin bath and wound on a mandrel or spool. The resulting metal fiber material/resin combination locks the CNTs on the metal fiber material allowing for easier handling and composite fabrication. In some embodiments, CNT infusion is used to provide improved filament winding. Thus, CNTs formed on metal fibers such as metal tow, are passed through a resin bath to produce resin-impregnated, CNT-infused metal tow. After resin impregnation, the metal tow can be positioned on the surface of a rotating mandrel by a delivery head. The tow can then be wound onto the mandrel in a precise geometric pattern in known fashion.

The winding process described above provides pipes, tubes, or other forms as are characteristically produced via a male mold. But the forms made from the winding process disclosed herein differ from those produced via conventional filament winding processes. Specifically, in the process disclosed herein, the forms are made from composite materials that include CNT-infused tow. Such forms will therefore benefit from enhanced strength and the like, as provided by the CNT-infused tow. Example II below describes a process for producing a spoolable CNT-infused metal tow with linespeeds as high as 5 ft/min continuously using the processes described above.

In some embodiments, a continuous process for infusion of CNTs on spoolable metal fiber materials can achieve a linespeed between about 0.5 ft/min to about 36 ft/min. In this embodiment where the system is 3 feet long and operating at a 750° C. growth temperature, the process can be run with a linespeed of about 6 ft/min to about 36 ft/min to produce, for example, CNTs having a length between about 1 micron to about 10 microns. The process can also be run with a linespeed of about 1 ft/min to about 6 ft/min to produce, for example, CNTs having a length between about 10 microns to about 100 microns. The process can be run with a linespeed of about 0.5 ft/min to about 1 ft/min to produce, for example, CNTs having a length between about 100 microns to about 200 microns. The CNT length is not tied only to linespeed and growth temperature, however, the flow rate of both the carbon feedstock and the inert carrier gases can also influence CNT length.

In some embodiments, more than one metal fiber material can be run simultaneously through the process. For example, multiple tapes tows, filaments, strand and the like can be run through the process in parallel. Thus, any number of pre-fabricated spools of metal fiber material can be run in parallel through the process and re-spooled at the end of the process. The number of spooled metal fiber materials that can be run in parallel can include one, two, three, four, five, six, up to any number that can be accommodated by the width of the CNT-growth reaction chamber. Moreover, when multiple metal fiber materials are run through the process, the number of collection spools can be less than the number of spools at the start of the process. In such embodiments, metal yarn, tows, or the like can be sent through a further process of combining such metal fiber materials into higher ordered metal fiber materials such as woven fabrics or the like. The continuous process can also incorporate a post processing chopper that facilitates the formation CNT-infused metal chopped fiber mats, for example.

In some embodiments, processes of the invention allow for synthesizing a first amount of a first type of carbon nanotube on the metal fiber material, in which the first type of carbon nanotube is selected to alter at least one first property of the metal fiber material. Subsequently, processes of the invention allow for synthesizing a second amount of a second type of carbon nanotube on the metal fiber material, in which the second type of carbon nanotube is selected to alter at least one second property of the metal fiber material.

In some embodiments, the first amount and second amount of CNTs are different. This can be accompanied by a change in the CNT type or not. Thus, varying the density of CNTs can be used to alter the properties of the original metal fiber material, even if the CNT type remains unchanged. CNT type can include CNT length and the number of walls, for example. In some embodiments the first amount and the second amount are the same. If different properties are desirable in this case, along the two different stretches of the spoolable material, then the CNT type can be changed, such as the CNT length. For example, longer CNTs can be useful in electrical/thermal applications, while shorter CNTs can be useful in mechanical strengthening applications.

In light of the aforementioned discussion regarding altering the properties of the metal fiber materials, the first type of carbon nanotube and the second type of carbon nanotube can be the same, in some embodiments, while the first type of carbon nanotube and the second type of carbon nanotube can be different, in other embodiments. Likewise, the first property and the second property can be the same, in some embodiments. For example, the EMI shielding property can be the property of interest addressed by the first amount and type of CNTs and the 2nd amount and type of CNTs, but the degree of change in this property can be different, as reflected by differing amounts, and/or types of CNTs employed. Finally, in some embodiments, the first property and the second property can be different. Again this may reflect a change in CNT type. For example the first property can be mechanical strength with shorter CNTs, while the second property can be electrical/thermal properties with longer CNTs. One skilled in the art will recognize the ability to tailor the properties of the metal fiber material through the use of different CNT densities, CNT lengths, and the number of walls in the CNTs, such as single-walled, double-walled, and multi-walled, for example.

In some embodiments, processes of the present invention provides synthesizing a first amount of carbon nanotubes on a metal fiber material, such that this first amount allows the carbon nanotube-infused metal fiber material to exhibit a second group of properties that differ from a first group of properties exhibited by the metal fiber material itself. That is, selecting an amount that can alter one or more properties of the metal fiber material, such as tensile strength. The first group of properties and second group of properties can include at least one of the same properties, thus representing enhancing an already existing property of the metal fiber material. In some embodiments, CNT infusion can impart a second group of properties to the carbon nanotube-infused metal fiber material that is not included among the first group of properties exhibited by said metal fiber material itself.

In some embodiments, a first amount of carbon nanotubes is selected such that the value of at least one property selected from the group consisting of tensile strength, Young's Modulus, shear strength, shear modulus, toughness, compression strength, compression modulus, density, EM wave absorptivity/reflectivity, acoustic transmittance, electrical conductivity, and thermal conductivity of the carbon nanotube-infused metal fiber material differs from the value of the same property of the metal fiber material itself.

Tensile strength can include three different measurements: 1) Yield strength which evaluates the stress at which material strain changes from elastic deformation to plastic deformation, causing the material to deform permanently; 2) Ultimate strength which evaluates the maximum stress a material can withstand when subjected to tension, compression or shearing; and 3) Breaking strength which evaluates the stress coordinate on a stress-strain curve at the point of rupture. Multiwalled carbon nanotubes, in particular, have the highest tensile strength of any material yet measured, with a tensile strength of 63 GPa having been achieved. Moreover, theoretical calculations have indicated possible tensile strengths of CNTs of about 300 GPa. Thus, CNT-infused metal fiber materials, are expected to have substantially higher ultimate strength compared to the parent metal fiber material. As described above, the increase in tensile strength will depend on the exact nature of the CNTs used as well as the density and distribution on the metal fiber material. CNT-infused metal fiber materials can exhibit a 1.5 times improvement in tensile properties, for example. Exemplary CNT-infused metal fiber materials can have as high as two times the shear strength as the parent unfunctionalized metal fiber material and as high as two times the compression strength.

Young's modulus is a measure of the stiffness of an isotropic elastic material. It is defined as the ratio of the uniaxial stress over the uniaxial strain in the range of stress in which Hooke's Law holds. This can be experimentally determined from the slope of a stress-strain curve created during tensile tests conducted on a sample of the material.

Composite shear strength evaluates the stress at which a material fails when a load is applied perpendicular to the fiber direction. Compression strength evaluates the stress at which a material fails when a compressive load is applied.

Electrical conductivity or specific conductance is a measure of a material's ability to conduct an electric current. CNTs with particular structural parameters such as the degree of twist, which relates to CNT chirality, can be highly conducting, thus exhibiting metallic properties. A recognized system of nomenclature (M. S. Dresselhaus, et al. Science of Fullerenes and Carbon Nanotubes, Academic Press, San Diego, Calif. pp. 756-760, (1996)) has been formalized and is recognized by those skilled in the art with respect to CNT chirality. Thus, for example, CNTs are distinguished from each other by a double index (n,m) where n and m are integers that describe the cut and wrapping of hexagonal graphite so that it makes a tube when it is wrapped onto the surface of a cylinder and the edges are sealed together. When the two indices are the same, m=n, the resultant tube is said to be of the "arm-chair" (or n,n) type, since when the tube is cut perpendicular to the CNT axis only the sides of the hexagons are exposed and their pattern around the periphery of the tube edge resembles the arm and seat of an arm chair repeated n times. Arm-chair CNTs, in particular SWNTs, are metallic, and have extremely high electrical and thermal conductivity. In addition, such SWNTs have-extremely high tensile strength.

In addition to the degree of twist CNT diameter also effects electrical conductivity. As described above, CNT diameter can be controlled by use of controlled size CNT-forming catalyst nanoparticles. CNTs can also be formed as semi-conducting materials. Conductivity in multi-walled CNTs (MWNTs) can be more complex. Interwall reactions within MWNTs can redistribute current over individual tubes non-uniformly. By contrast, there is no change in current across different parts of metallic single-walled nanotubes (SWNTs). Carbon nanotubes also have very high thermal conductivity, comparable to diamond crystal and in-plane graphite sheet.

The CNT-infused metal fiber materials can benefit from the presence of CNTs not only in the properties described above, but can also provide lighter materials in the process. Thus, such lower density and higher strength materials translates to greater strength to weight ratio. It is understood that modifications which do not substantially affect the activity of the various embodiments of this invention are also included within the definition of the invention provided herein. Accordingly, the following examples are intended to illustrate but not limit the present invention.

Example I

This example shows how a metal fiber material can be infused with CNTs in a continuous process to target electrical and thermal property improvements.

In this example, the maximum loading of CNTs on fibers is targeted. Stainless steel fiber with 20 µm in diameter (HM Wire International Inc., Canton, Ohio) is implemented as the metal fiber substrate.

Figure 9:
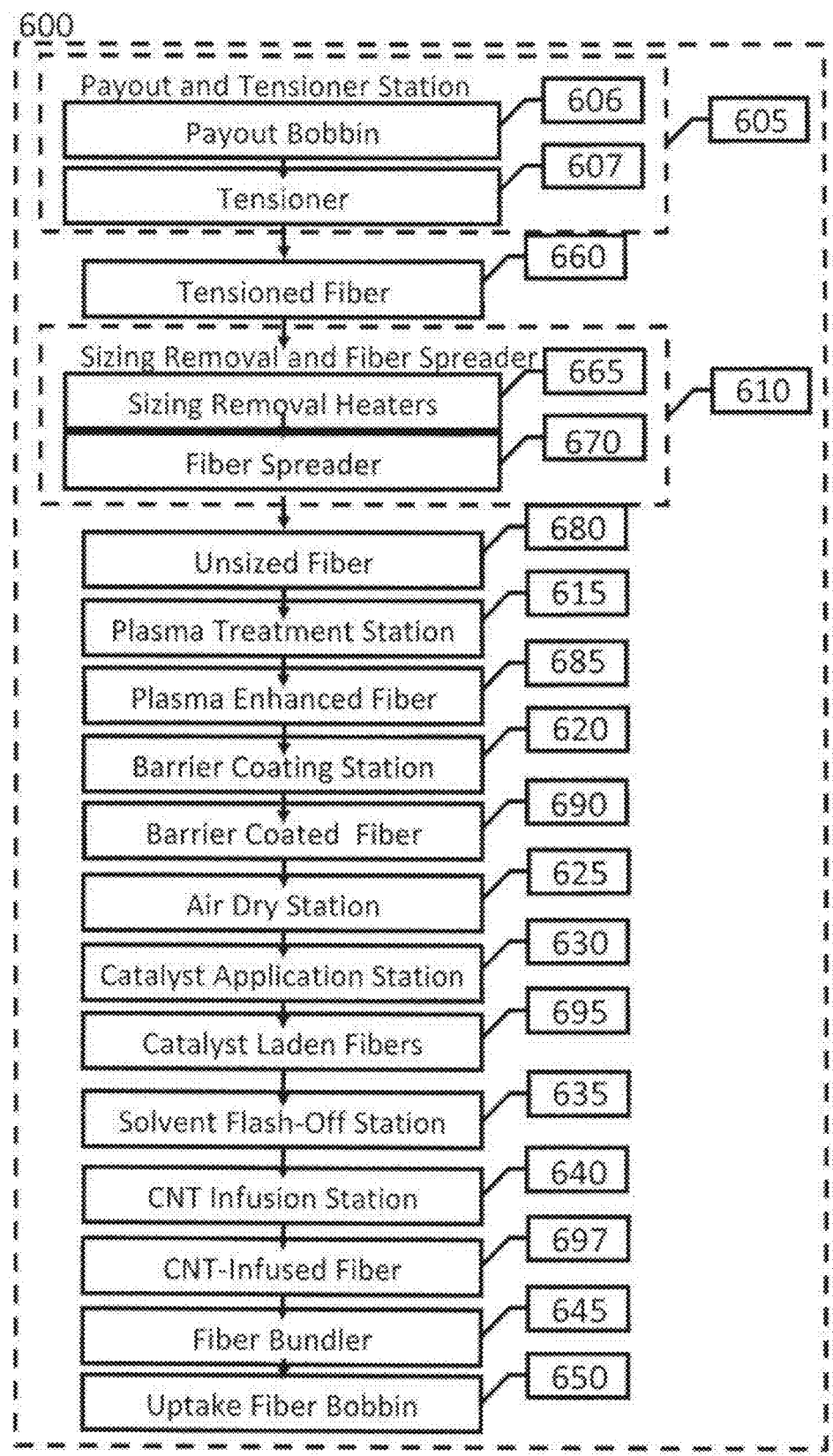
FIG. 9 shows a system for implementing a process for producing CNT-infused metal fiber material.

FIG. 9 depicts system 600 for producing CNT-infused fiber in accordance with the illustrative embodiment of the present invention. System 600 includes a metal fiber material payout and tensioner station 605, sizing removal and fiber spreader station 610, plasma treatment station 615, barrier coating application station 620, air dry station 625, catalyst application station 630, solvent flash-off station 635, CNT-infusion station 640, fiber bundler station 645, and metal fiber material uptake bobbins 650, interrelated as shown.

Payout and tension station 605 includes payout bobbins 606 and tensioner 607. The payout bobbin delivers metal fiber material 660 to the process; the fiber is tensioned via tensioner 607. For this example, the metal fiber is processed at a linespeed of 2 ft/min.

Although not common, a metal fiber material can have a sizing. In such embodiments, fiber material 660 is delivered to sizing removal and fiber separator station 610 which includes sizing removal heaters 665 and fiber separator 670. At this station, any "sizing" that is on fiber 660 is removed. Typically, removal is accomplished by burning the sizing off of the fiber. Any of a variety of heating means can be used for this purpose, including, for example, an infrared heater, a muffle furnace, and other non-contact heating processes. Sizing removal can also be accomplished chemically. The fiber spreader separates the individual elements of the metal fiber bundle. Various techniques and apparatuses can be used to spread/separate fiber, such as mechanical separation, pulling the fiber over and under flat, uniform-diameter bars, or over and under variable-diameter bars, or over bars with radially-expanding grooves and a kneading roller, over a vibratory bar, etc. Spreading the fiber enhances the effectiveness of downstream operations, such as plasma application, barrier coating application, and catalyst application, by exposing more fiber surface area.

Multiple sizing removal heaters 665 can be placed throughout the fiber spreader 670 which allows for gradual, simultaneous desizing and spreading of the fibers. Payout and tension station 605 and sizing removal and fiber spreader station 610 are routinely used in the fiber industry; those skilled in the art will be familiar with their design and use.

The temperature and time required for burning off the sizing vary as a function of (1) the sizing material and (2) the commercial source/identity of metal fiber material 660. A sizing on a metal fiber material can be removed at about 450° C. At this temperature, it can take as long as 15 minutes to ensure a complete burn off of the sizing. Increasing the temperature above this burn temperature can reduce burn-off time. Thermogravimetric analysis is used to determine minimum burn-off temperature for sizing for a particular commercial product.

Depending on the timing required for sizing removal, sizing removal heaters may not necessarily be included in the CNT-infusion process proper; rather, removal can be performed separately (e.g., in parallel, etc.). In this way, an inventory of sizing-free metal fiber material can be accumulated and spooled for use in a CNT-infused fiber production line that does not include fiber removal heaters. The sizing-free fiber is then spooled in payout and tension station 605. This production line can be operated at higher speed than one that includes sizing removal.

Unsized fiber 680 is delivered to plasma treatment station 615. For this example, atmospheric plasma treatment is utilized in a 'downstream' manner from a distance of 1 mm from the spread metal fiber material. The gaseous feedstock is comprised of 100% helium.

Plasma enhanced fiber 685 is delivered to barrier coating station 620. In this illustrative example, a siloxane-based barrier coating solution is employed in a dip coating configuration. The solution is 'Accuglass T-11 Spin-On Glass' (Honeywell International Inc., Morristown, N.J.) diluted in isopropyl alcohol by a dilution rate of 20 to 1 by volume. The resulting barrier coating thickness on the metal fiber material is approximately 100 nm. The barrier coating can be applied at room temperature in the ambient environment.

Barrier coated metal fiber 690 is delivered to air dry station 625 for partial curing of the nanoscale barrier coating. The air dry station sends a stream of heated air across the entire metal fiber spread. Temperatures employed can be in the range of 100° C. to about 350° C.

After air drying, barrier coated metal fiber 690 is delivered to catalyst application station 630. In this example, an iron oxide-based CNT forming catalyst solution is employed in a dip coating configuration. The solution is 'EFH-1' (Ferrotec Corporation, Bedford, N.H.) diluted in hexane by a dilution rate of 400 to 1 by volume. A monolayer of catalyst coating is nearly achieved on the metal fiber material. 'EFH-1' prior to dilution has a nanoparticle concentration ranging from 3-15% by volume. The iron oxide nanoparticles are of composition $Fe_2O_3$ and $Fe_3O_4$ and are approximately 8 nm in diameter.

Catalyst-laden metal fiber material 695 is delivered to solvent flash-off station 835. The solvent flash-off station sends a stream of air across the entire metal fiber spread. In this example, room temperature air can be employed in order to flash-off all hexane left on the catalyst-laden metal fiber material.

After solvent flash-off, catalyst-laden fiber 695 is finally advanced to CNT-infusion station 640. In this example, a rectangular reactor with a 12 inch growth zone is used to employ CVD growth at atmospheric pressure. 96.0% of the total gas flow is inert gas (Nitrogen) and the other 4.0% is the carbon feedstock (acetylene). The growth zone is held at 750° C. For the rectangular reactor mentioned above, 750° C. is a relatively high growth temperature, which allows for long length CNT growth for improved thermal and electrical properties.

After CNT-infusion, CNT-infused fiber 697 is re-bundled at fiber bundler station 845. This operation recombines the individual strands of the fiber, effectively reversing the spreading operation that was conducted at station 610.

The bundled, CNT-infused fiber 697 is wound about uptake fiber bobbins 650 for storage. CNT-infused fiber 697 is loaded with CNTs approximately 100 µm in length and is then ready for use in composite materials with enhanced electrical and thermal properties.

It is noteworthy that some of the operations described above can be conducted under inert atmosphere or vacuum for environmental isolation. For example, if sizing is being burned off of a metal fiber material, the fiber can be environmentally isolated to contain off-gassing and prevent damage from moisture. For convenience, in system 600, environmental isolation is provided for all operations, with the exception of metal fiber material payout and tensioning, at the beginning of the production line, and fiber uptake, at the end of the production line.

Example II

This example shows how metal fiber material can be infused with CNTs in a continuous process to target improvements in mechanical properties, especially interfacial characteristics such as shear strength.

In this example, loading of shorter CNTs on fibers is targeted. In this example, Aluminum fiber tow with diameter of 20 µm (HM Wire International Inc., Canton, Ohio) is implemented as the metal fiber substrate.

Figure 10:
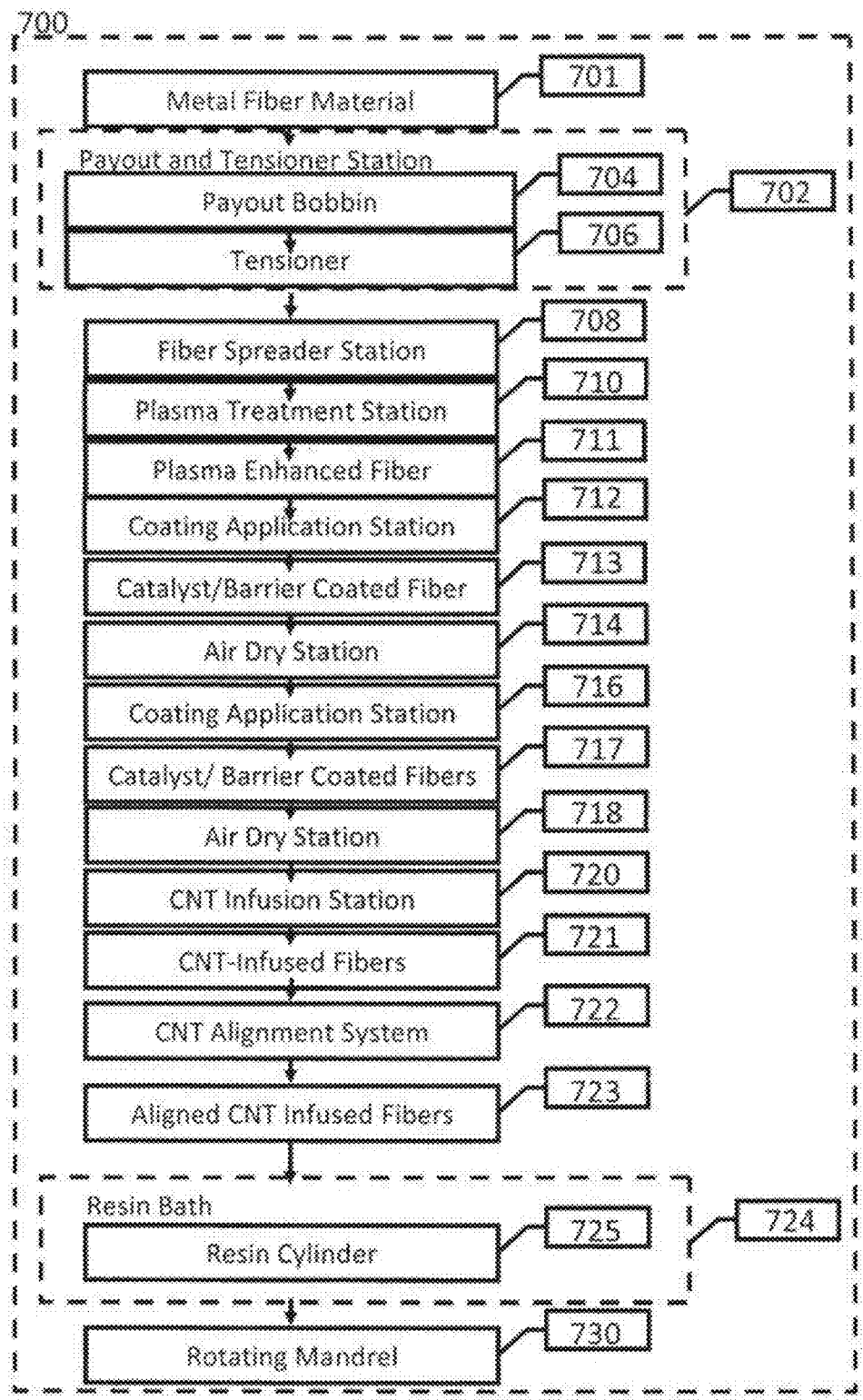
FIG. 10 shows another system for implementing a process for producing CNT-infused metal fiber material, with a subsequent resin coating and winding process.

FIG. 10 depicts system 700 for producing CNT-infused fiber in accordance with the illustrative embodiment of the present invention, and involves many of the same stations and processes described in system 600. System 700 includes a metal fiber material payout and tensioner station 702, fiber spreader station 708, plasma treatment station 710, coating application station 712, air dry station 714, a second coating application station 716, a second air dry station 718, CNT-infusion station 720, CNT alignment system 722, resin bath 724, and rotating mandrel 730, interrelated as shown.

Payout and tension station 702 includes payout bobbin 704 and tensioner 706. The payout bobbin delivers metal fiber material 701 to the process; the fiber is tensioned via tensioner 706. For this example, the metal fiber is processed at a linespeed of 5 ft/min.

Fiber material 701 is delivered to fiber spreader station 708. As this fiber is manufactured without sizing, a sizing removal process is not incorporated as part of fiber spreader station 708. The fiber spreader separates the individual elements of the fiber in a similar manner as described in fiber spreader 670.

Fiber material 701 is delivered to plasma treatment station 710. For this example, atmospheric plasma treatment is utilized in a 'downstream' manner from a distance of 12 mm from the spread metal fiber material. The gaseous feedstock is comprised of oxygen in the amount of 1.1% of the total inert gas flow (helium). Controlling the oxygen content on the surface of metal fiber material is an effective way of enhancing the adherence of subsequent coatings, and is therefore desirable for enhancing mechanical properties of a metal fiber composite.

Plasma enhanced fiber 711 is delivered to coating application station 712. In this example, an iron oxide based catalyst and a barrier coating material is combined into a single 'hybrid' solution and is employed in a dip coating configuration. The 'hybrid' solution is 1-part-by-volume 'EFH-1', 5-parts 'Accuglass T-11 Spin-On Glass', 24-parts hexane, 24-parts isopropyl alcohol, and 146-parts tetrahydrofuran. The benefit of employing such a 'hybrid' coating is that it marginalizes the effect of fiber degradation at high temperatures. Without being bound by theory, degradation to metal fiber materials is intensified by the sintering of catalyst NPs at high temperatures (the same temperatures vital to the growth of CNTs). By encapsulating each catalyst NP with its own barrier coating, it is possible to control this effect. Because increases in mechanical properties, and not thermal/electrical properties, is being targeted, it is desirable to maintain the integrity of the metal fiber base-material, therefore a 'hybrid' coating can be employed.

Catalyst-laden and barrier coated metal fiber material 713 is delivered to air dry station 714 for partial curing of the barrier coating. The air dry station sends a stream of heated air across the entire metal fiber spread. Temperatures employed can be in the range of 100° C. to about 350° C.

After air drying, the catalyst and barrier coating-laden metal fiber 713 is delivered to coating application station 716, which is identical to coating application station 712. The same 'hybrid' solution is used (1-part-by-volume 'EFH-1', 5-parts 'Accuglass T-11 Spin-On Glass', 24-parts hexane, 24-parts isopropyl alcohol, and 146-parts tetrahydrofuran). For this example, a configuration which includes multiple coating application stations is utilized to optimized the coverage of the 'hybrid' coating on the plasma enhanced fiber 711.

Catalyst and barrier coating-laden metal fiber 717 is delivered to air dry station 718 for partial curing of the barrier coating, and is identical to air dry station 714.

After air drying, catalyst and barrier coating-laden metal fiber 717 is finally advanced to CNT-infusion station 720. In this example, a rectangular reactor with a 12 inch growth zone is used to employ CVD growth at atmospheric pressure. 97.6% of the total gas flow is inert gas (Nitrogen) and the other 2.4% is the carbon feedstock (acetylene). The growth zone is held at 600° C. For the rectangular reactor mentioned above, 600° C. is relatively low growth temperature, which along with the low growth temperature to prevent melting the aluminum, allows for CNT growth.

CNT-infused fibers 721 is then passed through the CNT alignment system 722, where a series of dies are used to mechanically align the CNTs' axis in the direction of each roving. Tapered dies ending with a 0.125 inch diameter opening is used to aid in the alignment of the CNTs.

After passing through CNT alignment system 722, aligned CNT-infused fibers 723 is delivered to resin bath 724. The resin bath contains resin for the production of a composite material comprising the CNT-infused fiber and the resin. This resin can include commercially-available resin matrices such as polyester (e.g., orthophthalic polyesters, etc.), improved polyester (e.g., isophthalic polyesters, etc.), epoxy, and vinyl ester.

Resin bath 724 can be implemented in a variety of ways, two of which are described below. First, resin bath 724 can be implemented as a doctor blade roller bath wherein a polished rotating cylinder (e.g., cylinder 725) that is disposed in the bath picks up resin as it turns. The doctor bar (not depicted in FIG. 10) presses against the cylinder to obtain a precise resin film thickness on cylinder 725 and pushes excess resin back into the bath. As the metal fiber roving 723 is pulled over the top of cylinder 725, it contacts the resin film and wets out. Alternatively, resin bath 724 is used as an immersion bath wherein metal fiber roving 723 is submerged into the resin and then pulled through a set of wipers or rollers that remove excess resin.

After leaving resin bath 724, resin-wetted, CNT-infused fibers 723 are passed through various rings, eyelets and, typically, a multi-pin "comb" (not depicted) that is disposed behind a delivery head (not depicted). The comb keeps the metal fibers 723 separate until they are brought together in a single combined band on rotating mandrel 730. The mandrel acts as a mold for a structure requiring composites material with improved mechanical strength. It is to be understood that the above-described embodiments are merely illustrative of the present invention and that many variations of the above-described embodiments can be devised by those skilled in the art without departing from the scope of the invention. For example, in this Specification, numerous specific details are provided in order to provide a thorough description and understanding of the illustrative embodiments of the present invention. Those skilled in the art will recognize, however, that the invention can be practiced without one or more of those details, or with other processes, materials, components, etc.

Furthermore, in some instances, well-known structures, materials, or operations are not shown or described in detail to avoid obscuring aspects of the illustrative embodiments. It is understood that the various embodiments shown in the Figures are illustrative, and are not necessarily drawn to scale. Reference throughout the specification to "one embodiment" or "an embodiment" or "some embodiments" means that a particular feature, structure, material, or characteristic described in connection with the embodiment(s) is included in at least one embodiment of the present invention, but not necessarily all embodiments. Consequently, the appearances of the phrase "in one embodiment," "in an embodiment," or "in some embodiments" in various places throughout the Specification are not necessarily all referring to the same embodiment. Furthermore, the particular features, structures, materials, or characteristics can be combined in any suitable manner in one or more embodiments. It is therefore intended that such variations be included within the scope of the following claims and their equivalents.

What is claimed is the following:

1. A continuous CNT infusion process comprising:
    disposing a barrier coating and a carbon nanotube (CNT)-forming catalyst on a surface of a metal fiber material of spoolable dimensions;
        wherein the barrier coating is selected from the group consisting of an alkoxysilane, a methylsiloxane, an alumoxane, alumina nanoparticles, spin on glass and glass nanoparticles; and
    synthesizing carbon nanotubes on said metal fiber material by exposing the metal fiber material to carbon nanotube growth conditions, thereby forming a carbon nanotube-infused metal fiber material;
        wherein the metal fiber material is moving while disposing the barrier coating and the CNT-forming catalyst, and while synthesizing the carbon nanotubes.

2. The process of claim 1, wherein said continuous CNT infusion process has a material residence time in the carbon nanotube growth conditions of between about 5 to about 300 seconds.

3. The process of claim 2, wherein a material residence time of about 5 to about 30 seconds produces CNTs having a length between about 1 micron to about 10 microns.

4. The process of claim 2, wherein a material residence time of about 30 to about 180 seconds produces CNTs having a length between about 10 microns to about 100 microns.

5. The process of claim 2, wherein a material residence time of about 180 to about 300 seconds produces CNTs having a length between about 100 microns to about 500 microns.

6. The process of claim 1, wherein more than one metal fiber material is simultaneously exposed to the carbon nanotube growth conditions.

7. The process of claim 1 further comprising:
    removing a sizing material from said metal fiber material before disposing said barrier coating or said CNT-forming catalyst on said metal fiber material.

8. The process of claim 1, wherein said CNT-forming catalyst is an iron-based nanoparticle catalyst.

9. The process of claim 1, wherein disposing said CNT-forming catalyst on said metal fiber material comprises spraying, dip coating, or gas phase deposition onto said metal fiber material.

10. The process of claim 1, wherein disposing said barrier coating is simultaneous with disposing said CNT-forming catalyst on said metal fiber material.

11. The process of claim 1, wherein said barrier coating is conformally disposed on said metal fiber material prior to disposing said CNT-forming catalyst on said metal fiber material.

12. A continuous CNT infusion process comprising:
disposing a barrier coating and a carbon nanotube (CNT)-forming catalyst on a surface of a metal fiber material of spoolable dimensions;
wherein said barrier coating is conformally disposed on said metal fiber material prior to disposing said CNT-forming catalyst on said metal fiber material;
partially curing said barrier coating prior to disposing said CNT-forming catalyst on said metal fiber material; and
synthesizing carbon nanotubes on said metal fiber material by exposing the metal fiber material to carbon nanotube growth conditions, thereby forming a carbon nanotube-infused metal fiber material;
wherein the metal fiber material is moving while disposing the barrier coating and the CNT-forming catalyst, and while synthesizing the carbon nanotubes.

13. The process of claim 12 further comprising:
curing said barrier coating after disposing said CNT-forming catalyst on said metal fiber material.

14. The process of claim 1, wherein synthesizing carbon nanotubes comprises CVD growth.

15. The process of claim 1 further comprising:
after synthesizing the carbon nanotubes, applying sizing to said carbon nanotube-infused metal fiber material.

16. The process of claim 1 further comprising:
after synthesizing the carbon nanotubes, applying a matrix material to said carbon nanotube-infused metal fiber material.

17. The process of claim 1, wherein the barrier coating is deposited from a liquid onto the metal fiber material.

18. The process of claim 1, wherein the carbon nanotubes are uniform in length and uniform in distribution.

* * * * *